United States Patent
Imai

(10) Patent No.: US 8,174,110 B2
(45) Date of Patent: May 8, 2012

(54) SEMICONDUCTOR DEVICE HAVING AT LEAST TWO TERMINALS AMONG THE PLURALITY OF TERMINALS ELECTRICALLY CONNECTED TO EACH OTHER WHILE NOT BEING ADJACENT TO ONE OTHER AND NOT BEING CONNECTED TO INTERNAL CIRCUIT

(75) Inventor: Hideo Imai, Shimosuwa (JP)

(73) Assignee: Epson Imaging Devices Corporation (JP)

(*) Notice: Subject to any disclaimer, the term of this patent is extended or adjusted under 35 U.S.C. 154(b) by 486 days.

(21) Appl. No.: 12/203,199

(22) Filed: Sep. 3, 2008

(65) Prior Publication Data

US 2009/0057924 A1 Mar. 5, 2009

(30) Foreign Application Priority Data

Sep. 4, 2007 (JP) .................................. 2007-228599
Jul. 11, 2008 (JP) .................................. 2008-181432

(51) Int. Cl.
*H01L 23/48* (2006.01)

(52) U.S. Cl. .. 257/692; 257/688; 257/784; 257/E23.024

(58) Field of Classification Search .......... 257/784–786, 257/688, 692, E23.024
See application file for complete search history.

(56) References Cited

U.S. PATENT DOCUMENTS

| | | | | |
|---|---|---|---|---|
| 5,825,081 | A * | 10/1998 | Hosomi et al. | 257/668 |
| 6,048,753 | A * | 4/2000 | Farnworth et al. | 438/111 |
| 7,482,271 | B2 | 1/2009 | Hashimoto | |
| 7,525,181 | B2 * | 4/2009 | Kim | 257/673 |
| 7,642,627 | B2 * | 1/2010 | Yamasaki | 257/665 |
| 2003/0042618 | A1 | 3/2003 | Nose et al. | |
| 2003/0092326 | A1 * | 5/2003 | Nishikawa et al. | 439/894 |

FOREIGN PATENT DOCUMENTS

| | | |
|---|---|---|
| JP | 2731471 | 12/1997 |
| JP | 2001-223319 | 8/2001 |
| JP | 2003-004795 | 1/2003 |
| JP | 2003-068806 | 3/2003 |
| JP | 2007-027554 | 2/2007 |

* cited by examiner

*Primary Examiner* — Anh Mai
(74) *Attorney, Agent, or Firm* — Harness, Dickey & Pierce, P.L.C.

(57) ABSTRACT

A semiconductor device includes a base substrate including an internal circuit, a resin protrusion part that is disposed to protrude on an active face side of the base substrate, and a plurality of terminals that are formed by including an island-shaped conductive film disposed on the resin protrusion part. The plurality of terminals includes a terminal that a conductive state with the internal circuit, and a wiring line that electrically connects at least two terminals among the plurality of terminals is disposed on the active face side.

5 Claims, 14 Drawing Sheets

SEMICONDUCTOR DEVICE HAVING AT LEAST TWO TERMINALS AMONG THE PLURALITY OF TERMINALS ELECTRICALLY CONNECTED TO EACH OTHER WHILE NOT BEING ADJACENT TO ONE OTHER AND NOT BEING CONNECTED TO INTERNAL CIRCUIT

BACKGROUND

1. Technical Field

The present invention relates to a semiconductor device such as an IC (integrated circuit) chip, a semiconductor mounting structure for the semiconductor device, and an electro-optical device.

2. Related Art

Generally, electro-optical devices such as liquid crystal display devices have electro-optical panels as electro-optical elements used for display. The electro-optical panel includes a plurality of dot areas (that is, island-shaped areas) that are aligned in a predetermined two-dimensional arrangement, for example, a matrix shape. In each dot area, for example, one pair of electrodes disposed to face each other and an electro-optical material interposed between the one pair of electrodes are included. By applying a predetermined voltage value between one pair of electrodes selected from the plurality of dot areas, the optical state of the electro optical material changes, and accordingly, a desired image can be displayed.

In the electro-optical device, in order to select desired dot areas, a scanning signal is supplied to one of the one pair of electrodes, and a data signal is supplied to the other electrode. The scanning signal and the data signal are generated by a driving circuit having a predetermined circuit configuration. This driving circuit is, for example, formed inside a driving IC that is a semiconductor device. The driving IC is manufactured by performing a known semiconductor manufacturing method, for example, for a silicon wafer. The driving IC may be mounted on a substrate, which is formed of glass or plastic, that forms the electro-optical panel or a relay substrate that is connected to the substrate.

In the substrate or the relay substrate on which the driving IC is mounted, various wirings such as wirings used for supplying a signal and power to the driving IC or wirings used for transferring the scanning signal and the data signal that are generated by the driving IC to the electrodes inside the electro-optical panel are disposed. In the wirings, wiring terminals that are electrically connected to the driving IC are disposed.

Mounting the driving IC on the substrate is, for example, performed by using a flip chip mounting method. The flip chip mounting method is a method in which a connection electrode called a bump is formed on a circuit face, that is, an active face of the driving IC and the connection electrode is conductively connected to a wiring terminal on the substrate. In such a case, the driving IC is in a state in which the driving IC is packaged in an almost same size as a bare chip, that is, a chip-scale packaged state. The semiconductor mounting structure of the chip scale package has been disclosed, for example, in JP-A-2001-223319 (Page No. 4, FIGS. 1 and 2) and Japanese Patent No. 2731471 (Page Nos. 3 to 4, FIG. 1).

In JP-A-2001-223319, technology or conductively connecting a solder bump as a connection electrode to a wiring terminal disposed on the substrate has been disclosed. In addition, in Japanese Patent No. 2731471, an electrical connection structure in which a conductive body layer is formed on a protrusion part formed of a resin and the conductive body layer is brought into direct contact with a wiring terminal disposed on the substrate by using an adhesive agent has been disclosed.

Considering a case where the driving IC having a bare chip size is mounted on a substrate such as a glass substrate, a plurality of connection electrodes of the driving IC is electrically connected to a plurality of wiring terminals disposed on the substrate. The plurality of wiring terminals disposed on the substrate and wirings connected thereto are commonly formed on one face of the substrate by using a photo etching method. Thus, the wirings are needed to be insulated from one another, and it is difficult to form a cross-wiring that intersects a part of a wiring with other wirings in a same photo etching process. In other words, in order to form a cross-wiring, there is a problem that a new process is needed.

In addition, a case where the driving IC is mounted on the substrate and a relay substrate such as an FPC (flexible printed circuit) substrate is connected to the substrate or a case where the driving IC is mounted on the relay substrate will be considered. In such a case, when a cross wiring is to be formed on the relay substrate, generally ordinary wirings are needed to be formed on one face of the relay substrate and a cross wiring is needed to be formed on the other face. As described above, when the relay substrate is formed by using a double-sided wiring, the number of processes increases, and accordingly, there is a problem that the cost for the manufacturing process increases.

SUMMARY

An advantage of some aspects of the invention is that it provides a semiconductor device, a semiconductor mounting structure for the semiconductor device, and an electro-optical device. The invention can be implemented in the following forms or application examples.

Application Example 1

According to this application example, there is provided a semiconductor device including: a base substrate including an internal circuit; a resin protrusion part that is disposed to protrude on an active face side of the base substrate; and a plurality of terminals that are formed by including an island-shaped conductive film disposed on the resin protrusion part. The plurality of terminals includes a terminal that is in a conductive state with the internal circuit, and a wiring line that electrically connects at least two terminals among the plurality of terminals is disposed on the active face side.

In the above-described configuration, the base substrate represents, for example, a main body part of an IC chip. Generally, the IC chip represents a chip acquired from forming an internal circuit by forming semiconductor elements on a semiconductor wafer, covering the internal circuit with a passivation film that is a protection film, and slicing the semiconductor wafer by dicing. A face of the base substrate in which the internal circuit is formed is called an active face, the active face is covered with the passivation film, and a terminal for connection with a terminal of an external wiring line, that is, for example, a bump is formed on the surface of the passivation film. When a semiconductor device is mounted on a substrate, generally, a mounting process is performed in a state that the active face side faces the substrate. In other words, commonly, the active face of the semiconductor device becomes a mounting face.

Under the above-described configuration, a plurality of terminals disposed on the active face are bumps (hereinafter, this bumps are referred to as resin core bumps) that are formed by including an island-shaped conductive film on a resin protrusion part with the resin protrusion part used as a core (kernel). The resin core bump is a bump using elasticity of the resin protrusion part. The resin protrusion part may be formed as one protrusion part in a long straight line shape or island-shaped protrusion parts corresponding to the island-shaped conductive film. When the semiconductor device according to this application example is mounted on the substrate, the terminals disposed on the substrate and the conductive film of the semiconductor device are brought into contact in a large area with each other under an appropriate pressing force by elastically deforming the resin protrusion part. Accordingly, a stable connection state between terminals can be acquired.

In addition, among the plurality of terminals formed by including the island-shaped conductive film disposed on the base substrate, at least two terminals are electrically connected by the wiring line disposed on the active face side. Thus, at least two wiring lines formed on the mounting substrate can be connected together by using the wiring line disposed on the active side of the semiconductor device without cross-wiring or jump-wiring on the substrate. As a result, the degree of freedom for designing the wiring pattern can be improved without complicating the wiring pattern on the substrate. For example, even when the substrate is formed in a single-sided wiring state of one layer, a same wiring pattern as that acquired by using a double-sided wiring substrate or a single-sided substrate of multiple layers can be implemented by using the wiring line disposed on the active face side of the semiconductor device. In other words, the wiring state of one mounted substrate can be simplified or versified by providing the semiconductor device having an auxiliary wiring line.

Application Example 2

In the semiconductor device according to the above-described application example, the wiring line electrically connects at least two terminals among the plurality of terminals which are not adjacent to each other.

Under this configuration, at least two wiring lines that are disposed on the substrate and not adjacent to each other can be electrically connected without using jump wiring by mounting the semiconductor device on the substrate.

Application Example 3

In the semiconductor device according to the above-described application example, the wiring line connects terminals among the plurality of terminals that are not in a conductive state with the internal circuit.

The plurality of terminals disposed on the base substrate may include only conductive terminals that are in a conductive state with the internal circuit or include terminals, which are not in a conductive state with the internal circuit, in addition to the conductive terminals. A terminal that is not in a conductive state with the internal circuit is called a dummy terminal. The dummy terminal is frequently formed in a same outer shape as that of the conductive terminal.

By using the wiring line disposed on the active face side of the base substrate, the above-described dummy terminals among the plurality of terminals can be connected together. The wiring line may connect terminals that are in a conductive state with the internal circuit or connect the terminal in a conductive state with the internal circuit and the dummy terminal together.

Application Example 4

In the semiconductor device according to the above-described application example, it is preferable that a protection film having an insulation property is disposed on the active face, the resin protrusion part is disposed on the protection film, the conductive film is in a conductive state with the internal circuit through an opening formed on the protection film, and the wiring line is formed on the protection film.

Under such a configuration, the wiring line formed on the protection film of the base substrate may be formed as so-called a rewiring line.

The rewiring line is a wiring line formed by a process performed after a process for producing the base substrate of the semiconductor device, that is, so-called a preprocess is completed. Commonly, in the preprocess, an internal circuit including semiconductor elements is formed inside the base substrate by using a predetermined semiconductor manufacturing method, and a passivation film that is a protection film is formed so as to cover the surface of the internal circuit. In a terminal part (commonly formed of metal such as aluminum having low resistance) of the internal circuit, an opening is formed on the passivation film, and the terminal part becomes a pad for conduction with an external circuit. The preprocess that is a process performed before the rewiring line forming process includes forming an internal circuit on a semiconductor wafer, additionally forming a passivation film and terminal parts of the internal circuit, and forming the base substrate as one single body by dicing. Forming a wiring line on the base substrate by using a rewiring line means that a rewiring line can be formed in a process for forming a conductive film configuring a plurality of terminals. In such a case, a new forming process is not needed, and accordingly, formation of the wiring becomes very effective.

Application Example 5

In the semiconductor device according to the above-described application example, it is preferable that the wiring line is formed of a same material as that of the conductive film and is integrally formed with the connected terminals.

Under such a configuration, the wiring line can be formed simultaneously with forming the conductive film. Thus, the wiring can be formed without increasing component cost and manufacturing cost, and accordingly, the process becomes effective.

Application Example 6

In the semiconductor device according to the above-described application example, it is preferable that the film thickness of the wiring line is smaller than that of the conductive film that configures the terminals.

Under such a configuration, since the film thickness of the wiring line is smaller than that of the bonding terminal, the conductive film configuring the wiring line is not used unnecessarily.

In addition, in the semiconductor device according to the above-described application example, the wiring line can connect a plurality of terminals selected from among the plurality of terminals formed along a same side of the base substrate. In addition, the wiring line can connect one or a plurality of terminals selected from among a plurality of terminal formed along one side of the base substrate and one or a plurality of terminals selected from among the plurality of terminals formed along the other side of the base substrate.

Application Example 7

According to this application example, there is provided a semiconductor mounting structure in which a semiconductor device is mounted on a first substrate by using an adhesive agent. The semiconductor device includes: a base substrate including an internal circuit; a resin protrusion part that is disposed to protrude on an active face side of the base substrate; and a plurality of terminals that are formed by including an island-shaped conductive film disposed on the resin protrusion part and include a terminal in a conductive state with the internal circuit, and a wiring line that is disposed on the active face and connects at least two terminals among the plurality of terminals. A first connection terminal group including the plurality of bonding terminals disposed on the first substrate and the plurality of terminals of the semiconductor device are bonded.

Under such a configuration, at least two terminals among the plurality of terminals formed by including the island-shaped conductive film disposed on the active face side of the semiconductor device are connected by the wiring line disposed on the active face side. Thus, by mounting the semiconductor device on the first substrate in a flat form, at least two wiring lines among wirings connected to the first connection terminal group of the first substrate can be electrically connected through the semiconductor device. In other words, wiring lines connected to the first connection terminal group can be connected by a wiring line disposed on the active face side of the semiconductor device without using cross-wiring or jump-wiring on the first substrate. As a result, the degree of freedom for designing the wiring pattern can be improved without complicating the wiring pattern on the first substrate. In other words, by using mounting of the semiconductor device on the first substrate, the wiring state of the first substrate electrically connected to the semiconductor device can be simplified or versified.

Application Example 8

In the semiconductor mounting structure according to the above-described application example, the wiring line electrically connects at least two terminals among the plurality of terminals which are not adjacent to each other.

Under such a configuration, wirings connected to bonding terminals, which are not adjacent to each other, among the first connection terminal group of the first substrate can be connected through the semiconductor device without using jump-wiring on the first substrate.

Application Example 9

In the semiconductor mounting structure according to the above-described application example, the wiring line connects terminals among the plurality of terminals that are not in a conductive state with the internal circuit.

Under such a configuration, the wiring line connects terminals not in a conductive state with the internal circuit, that is, dummy terminals among the plurality of terminals. Accordingly, by using dummy terminals provided in the semiconductor device and the wirings connected to the dummy terminals, wirings of the first substrate which are not needed to be connected to one internal circuit can be connected.

Application Example 10

In the semiconductor mounting structure according to the above-described application example, it may be configured that the first substrate further includes a second connection terminal group that is electrically connected to the first connection terminal group, and a second substrate is mounted in the second connection terminal group.

Under such a configuration, the second substrate is connected to the first substrate through the second connection terminal group. Thus, the wirings disposed on the second substrate can be connected by using wirings disposed on the active face side of the semiconductor device without drawing out the wirings in a complicated manner. In other words, the wiring pattern of the second wirings can be simplified or diversified.

In this configuration, to the first substrate on which the semiconductor device is mounted, the second substrate that is another substrate is connected. In addition, in the configuration, the wiring lines of the semiconductor device can connect wirings disposed on the first substrate and wirings disposed on the second substrate. Under such a configuration, the wirings disposed on the second substrate and the wirings disposed on the first substrate can be in a conductive state simply and assuredly by using wiring lines disposed on the base substrate of the semiconductor device without using complicated drawing-out wiring or jump-wiring on the first substrate.

Application Example 11

In the semiconductor mounting structure according to the above-described application example, it is preferable that the adhesive agent that electrically bonds the first connection terminal group of the first substrate and the plurality of terminals of the semiconductor device is a non-conductive film that does not include conductive particles.

Under such a configuration, the plurality of terminals of the semiconductor device has the structure of a resin core bump. Thus, even when the adhesive agent does not include conductive particles, the plurality of terminals and the first connection terminal group of the first substrate can be stably bonded. In addition, after the semiconductor device is mounted on the first substrate in a flat form, the wiring disposed on the active face side of the semiconductor device and terminals other than the terminals connected to the wiring are not electrically shorted by conductive particles. In other words, since electrical short between the wiring and other terminals is prevented, reliability is improved, and the degree of freedom for wiring design on the active face side can be improve.

In the semiconductor mounting structure according to the above-described application example, the first substrate may be a non-flexible substrate formed of glass, a non-flexible substrate formed of plastic, or a flexible substrate. In the non-flexible substrate, it is difficult to employ a double-sided wiring pattern. When the semiconductor device having auxiliary wiring lines on the active face side is mounted on the non-flexible substrate, a same wiring state as that in a case where a double-sided wiring is implemented in the non-flexible substrate can be formed.

In the flexible substrate, a double-sided wiring pattern can be easily employed, compared to the non-flexible substrate. Thus, a cross wiring can be implemented by using the double-sided wiring. However, since the double-sided wiring incurs cost up, it is technology to be avoided as possible as can be. By mounting the semiconductor device having auxiliary wiring lines on the active face side on the flexible substrate, a substantial cross-wiring can be achieved by using the wiring of the semiconductor device without using the cross wiring on the flexible substrate in the double sided wiring pattern (This includes not only a case where the semiconductor device is directly mounted on the flexible substrate also a case where the semiconductor device is mounted in a flat form in wirings disposed on the flexible substrate through a wiring line disposed on the non-flexible substrate).

Application Example 12

According to this application example, there is provided an electro-optical device including: a first substrate in which an electro-optical material is supported; and a semiconductor device that is mounted flat on the first substrate for controlling driving of the electro-optical material. The semiconductor device is the semiconductor device according to the above-described application example.

Application Example 13

According to this application example, there is provided an electro-optical device having a semiconductor mounting structure in which a first substrate, in which an electro-optical material is supported, and a semiconductor device controlling driving of the electro-optical material are disposed in an area of the first substrate other than an area in which the electro-optical material is supported. The semiconductor mounting structure is the semiconductor mounting structure according to the above-described application example.

Under such configurations according to the above-described application examples, the wiring state of wiring lines disposed on the first substrate or wiring lines of other substrates mounted on the first substrate in a flat form can be simplified or diversified. For example, there is a case where a signal not directly relating to control of driving the electro-optical material is transmitted or received through the wiring line disposed on the first substrate and the semiconductor device. As an example of the signal, there is an electrical signal transmitted from the optical sensor or the temperature sensor disposed on the first substrate. In other words, necessity for forming a new wiring line decreases, and accordingly an electro-optical device having superior cost-performance can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
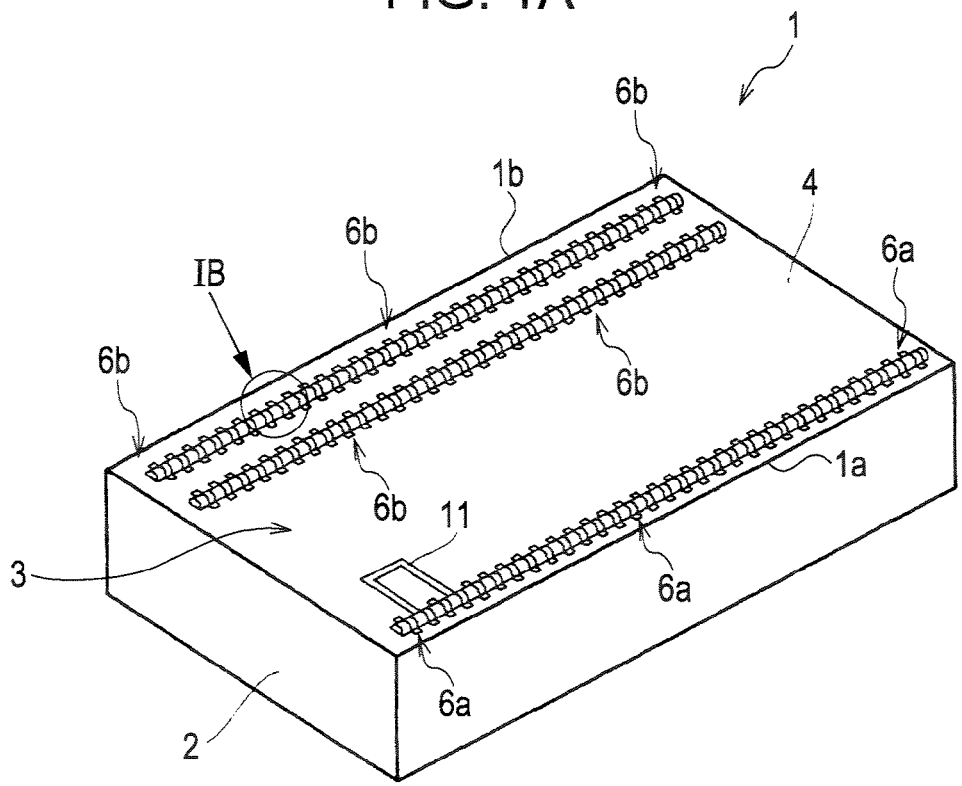
FIG. 1A is a schematic perspective view showing an IC chip as a semiconductor device according to an embodiment of the invention.

Hereinafter, a semiconductor device according to a first embodiment of the invention will be described. However, the invention is not limited to this embodiment.

In descriptions below, drawings will be referred to as are needed. However, in the drawings, in order to represent major constituent elements of a structure, which is constituted by a plurality of constituent elements, to be easily understood, there are cases where each element is represented in a size different from its real size.

Figure 2:
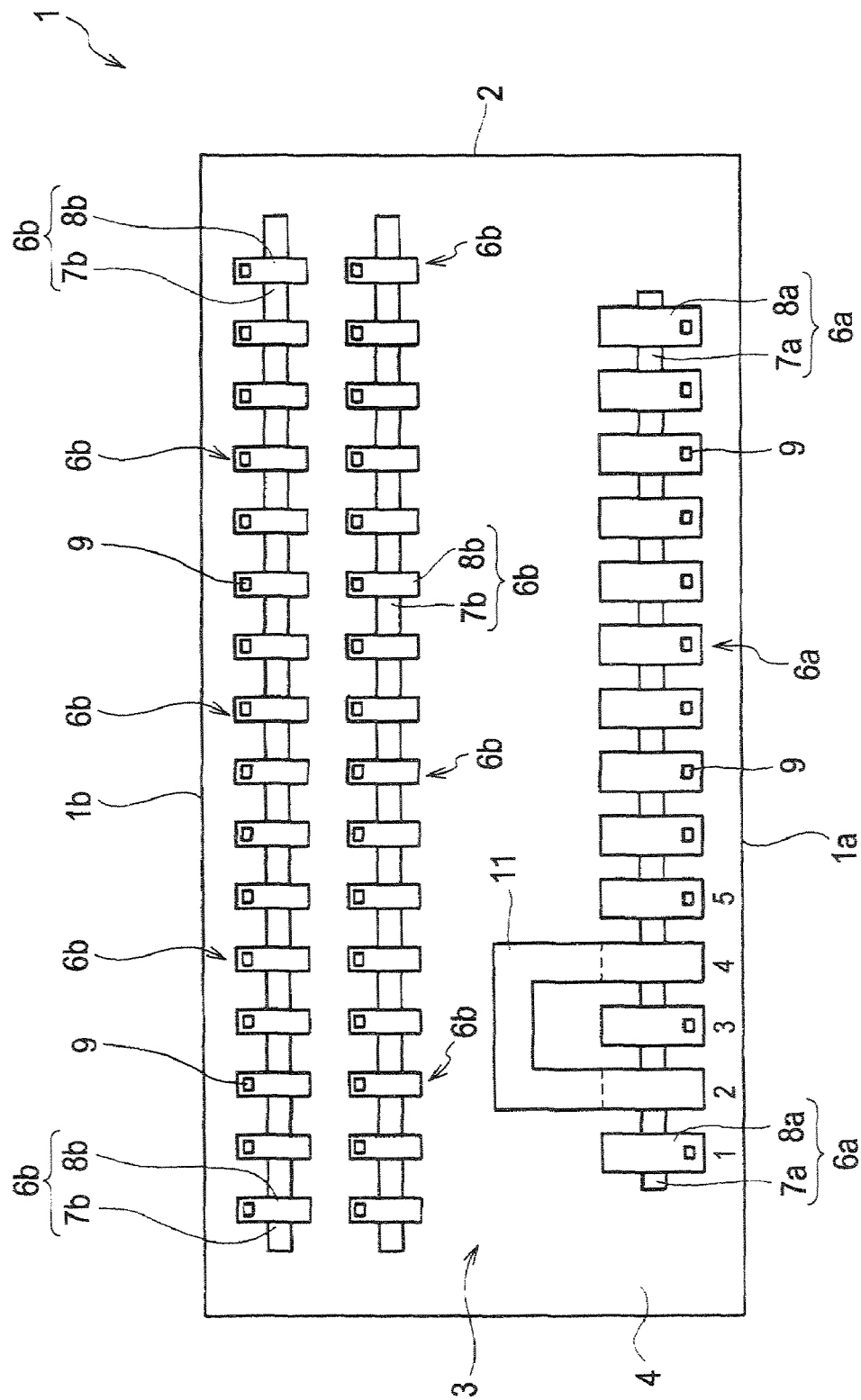
FIG. 2 is a schematic plan view showing the configuration of an active face of the IC chip.

FIG. 1A is a schematic perspective view showing an IC chip as a semiconductor device according to this embodiment. FIG. 2 is a schematic plan view showing the configuration of an active face of the IC chip. When the IC chip is mounted on a substrate not shown in the figure, the active face side becomes a mounting face, that is, a face on which the IC chip is mounted. FIG. 1A shows a state close to an outer shape of a real IC chip. In FIG. 2, in order to represent the configuration of terminals to be easily understood, the terminals are schematically shown in an enlarged scale. Thus, the number of terminals shown in FIG. 1A and that shown in FIG. 2 are different from each other.

Figure 1B:
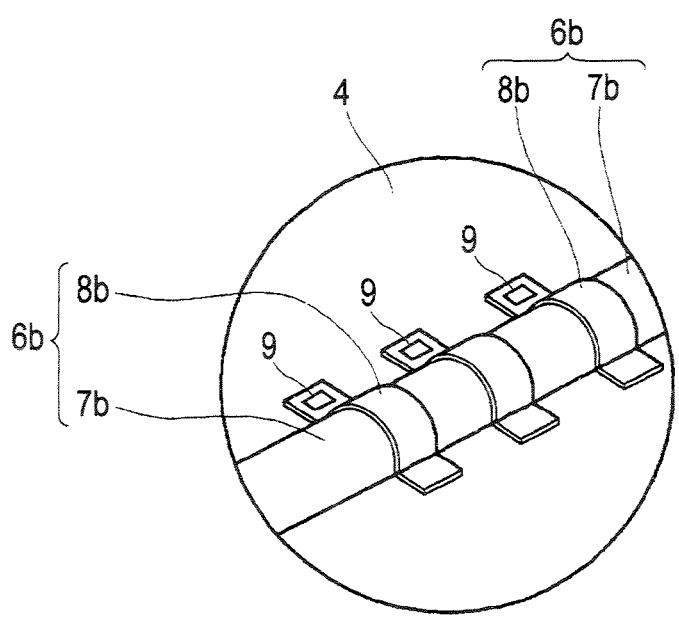
FIG. 1B is a partially enlarged view of FIG. 1A.

As shown in FIGS. 1A, 1B, and 2, the IC chip 1 as the semiconductor device as a base substrate 2 in which an internal circuit configured to include a semiconductor element is built. The base substrate 2 is one of a plurality of chips that are produced by forming an internal circuit on a semiconductor wafer, for example, formed of single crystal silicon, coating the surface of the internal circuit with a protection film, and slicing the semiconductor wafer by dicing. The internal circuit is formed by a known semiconductor manufacturing process. The internal circuit is, for example, configured to include a MOS transistor. Among six outer peripheral faces of the base substrate 2, a face on which the internal circuit is formed is so-called an active face. In FIGS. 1 and 2, the active face is denoted by a reference numeral 3. The entire face of the active face 3 is coated with so-called a passivation film 4.

On the passivation film 4, a plurality of terminals 6a and 6b in a dotted state, than is, in the shape of islands is disposed. The terminals 6a are input terminals of the IC chip 1, and the terminals 6b are output terminals of the IC chip. Input signal to the internal circuit are input from the input terminals 6a. In addition, output signals from the internal circuit are transferred externally through the output terminals 6b.

The plurality of input terminals 6a is disposed to be aligned in a straight line shape along one longer side 1a between a pair of longer sides 1a and 1b of the IC chip 1 that face each other.

The output terminals 6b are disposed to be aligned in straight line shapes along the other longer side 1b in two rows. In FIG. 2, in order to represent the configurations of the terminals 6a and the terminals 6b to be easily understood, the numbers of the terminals 6a and 6b are represented smaller than actual numbers thereof, and pitches of the terminals are represented wider than actual pitches.

The output terminal 6b, as shown in FIG. 1B that is a partially enlarged view of FIG. 1A, includes a resin protrusion part 7b disposed on the active face 3 side of base substrate 2 and a conductive film 8b in a dotted shape, that is, an island shape that is disposed on the resin protrusion part 7b. Although the resin protrusion parts 7b configure a protruded portion having a thin and long shape along the other longer side 1b, the resin protrusion part 7b constituting each output terminal 6b is a part corresponding to a terminal of the long and thin resin protrusion part. The resin protrusion part 7b is formed on the passivation film 4, for example, by using an acrylic resin, an epoxy resin, a phenol resin, a polyimide resin, a silicon-modified polyimide resin, or the like as its material. The resin protrusion part 7b is formed in a thin and long shape extending parallel to the longer side 1b of the IC chip 1 and having a semi-circle or partial-circle shaped cross section, a thin and long shape extending parallel to the longer side 1b of the IC chip 1 and having a semi-oval or partial-oval shape, or the like. In other words, the resin protrusion part 7 is a resin core formed in a long fish cake shape, that is, a long dome shape.

The conductive film 8b may use a single-layered structure of a metal such as TiW (titanum•tungsten), Au (gold), Cu, Ni, Pd, Al, Cr, Ti, W, NiV, or solder or a multi-layered structure of some metals described above. The conductive metal 8b has a three dimensional shape corresponding to the outer shape of the resin protrusion part 7b, as shown in FIG. 1B. In addition, the conductive metal 8b has a rectangular shape as a two-dimensional shape as shown in FIG. 2.

In FIG. 1B, a part of an end portion of the conductive film 8b is depressed. This shows a state in which the material of conductive film 8b of a part corresponding to an opening 9 is rotated along the opening 9 in a case where the opening 9 is formed in a corresponding part of the passivation film 4 and the material of the conductive film 8b is formed on the passivation film 4 as a film, for example, by using a sputtering method. In parts of the passivation film 4 corresponding to the openings 9, terminals, that is, pads (pads, for example, formed of aluminum) of the internal circuit of the base substrate 2 are disposed. This pads are, for example, connected to external connection terminals of a gate, a source, and a drain of a MOS transistor. Accordingly, each conductive film 8b is in conduction with the internal circuit though the openings 9. In other words, a part in which the conductive film 8b is disposed serves as a resin core bump.

When an aluminum pad is used, it is preferable that a TiW thin film is disposed as an underlying layer (seed layer). Thus, void that is generated by mutual diffusion of the aluminum and the conductive film that is laminated on the pad, for example, formed of Au (gold) can be suppressed. In other words, the TiW thin film has adhesiveness and barrier properties that are between those of aluminum and Au (gold).

The input terminal 6a, in view of the types of parts of constituent elements, is configured by same constituent elements as those of the output terminal 6b. In other words, the input terminal 6a, as shown in FIG. 2, includes a resin protrusion part 7a and a conductive film 8a. The resin protrusion part 7a is formed of a same material as that of the resin protrusion part 7b inside the output terminal 6b and has an almost same shape as that of the resin protrusion part 7b inside the output terminal 6b. However, since the number of required terminals is different from that inside the output terminal, a length of the resin protrusion parts 7a disposed along one longer side 1a of the IC chip 1 is different from that of the resin protrusion parts 7b on the output side. In addition, the conductive film 8a has a width larger than that of the conductive film 8b on the output side, and thus, the number of the conductive films 8a disposed along the one longer side 1a of the IC chip 1 is configured to be smaller than that of the conductive films 8b on the output side.

Among the plurality of the input terminals 6a, a second input terminal and a fourth input terminal, from the left end in FIG. 2 are connected with a rewiring line 11, which is a wiring disposed on the active face 3 side of the base substrate 2, to be in a conductive state. For input terminals 6a of numbers 2 and 4, the opening 9 is not formed in the passivation film 4 and a pad connected to the internal circuit is not disposed. In other words, the input terminals 6a of numbers 2 and 4 are formed as terminals not in conduction with the internal circuit, that is, so called dummy terminals. In some cases, the input terminals 6a of numbers 2 and 4 may be configured as actual terminals that are in conduction with the internal circuit and used for signal transmission.

The rewiring line 11 is formed simultaneously with the conductive films 8a and 8b by a same process as that for forming the conductive films 8a and 8b. Accordingly, the rewiring line 11 is formed of a same material as that of the conductive films 8a and 8b. As described above, the rewiring line 11 may use a single-layered structure of a metal such as TiW (titanum•tungsten), Au (gold), Cu, Ni, Pd, Al, Cr, Ti, W, NiV, or solder or a multi-layered structure of some metals described above.

Here, the rewiring line represents a wiring that is formed after completion of a preprocess in a case where a process from forming an internal circuit inside the base substrate 2 by using a known semiconductor manufacturing method to producing a bare chip by forming an additional passivation film 4 are referred to as the preprocess.

In this embodiment, the long and thin resin protrusion parts 7a and 7b are continuously disposed over the plurality of the conductive films 8a and 8b. However, island-shaped resin protrusion parts 7a and 7b each having a length corresponding to one terminal may be formed on the active face 3 side of the base substrate 2 so as to be aligned in straight lines, and the conductive films 8a and 8b may be formed for each of the resin protrusion parts 7a and 7b.

Next, a method of forming the terminals 6a and 6b and the rewiring line 11 will be described with reference to FIGS. 3A to 3C, 4D to 4F, 5G to 5H, and 6A to 6B. In the figures, diagrams shown on the right side are plan views, and diagrams shown on the left side are cross-section views taken along lines A-A of the plan views.

Figure 3A:
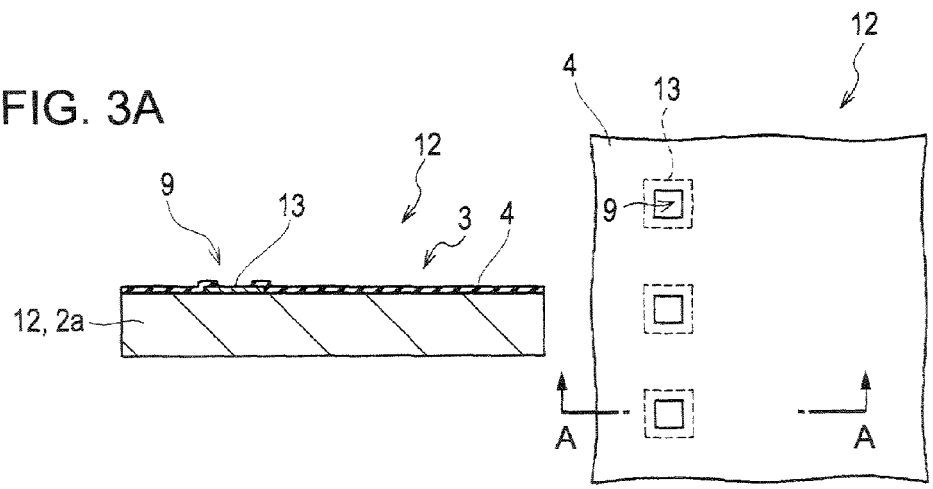
FIGS. 3A to 3C are schematic diagrams showing a method of forming terminals according to an embodiment of the invention.

First, as shown in FIG. 3A, a semiconductor wafer 12 is acquired. The semiconductor wafer 12 has, as is known, a circular plate shape of a predetermined diameter. In the semiconductor wafer 12, internal circuits corresponding to a plurality of IC ships are formed. In addition, reference sign 2a is a wafer main body that becomes the base substrate 2 shown in FIG. 1A later. On the active face 3 of the wafer main body 2a, pads 13 that are terminals are formed, and a passivation film 4 is formed additionally. In an area of the passivation film 4 corresponding to the pads 13, openings 9 are formed. Through this openings 9, the pads 13 face the outside thereof.

As a method of forming the pads 13, a method in which an aluminum thin film formed on the active face 3, for example, by using a sputtering method is patterned by using a photo etching method may be used.

As a method of forming the passivation film 4, a method in which areas of the pads 13 corresponding to the openings 9 are covered with a resist film and then the active face 3 is covered with a thin film such as SiO$_2$ (silicon dioxide), SiN (silicon nitride), or a polyimide resin is used. In addition, in the method, the resist film is peeled off.

Figure 3B:
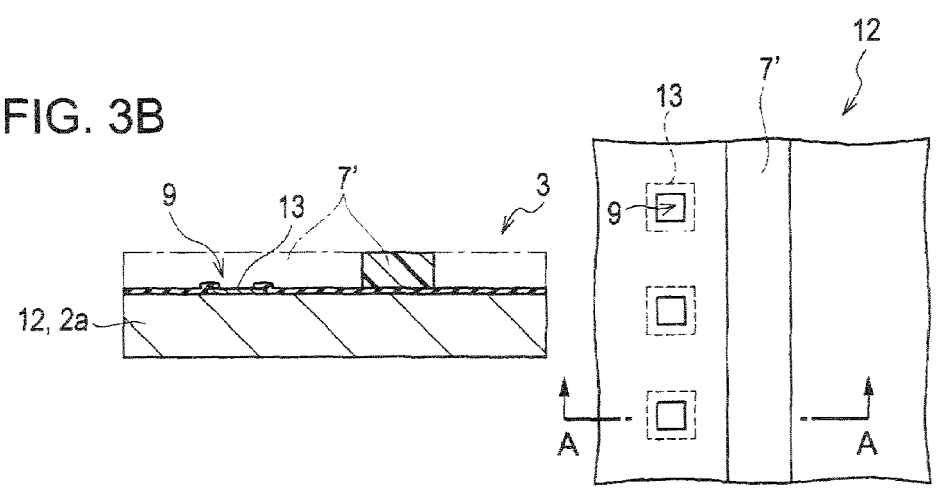
Figure 3C:
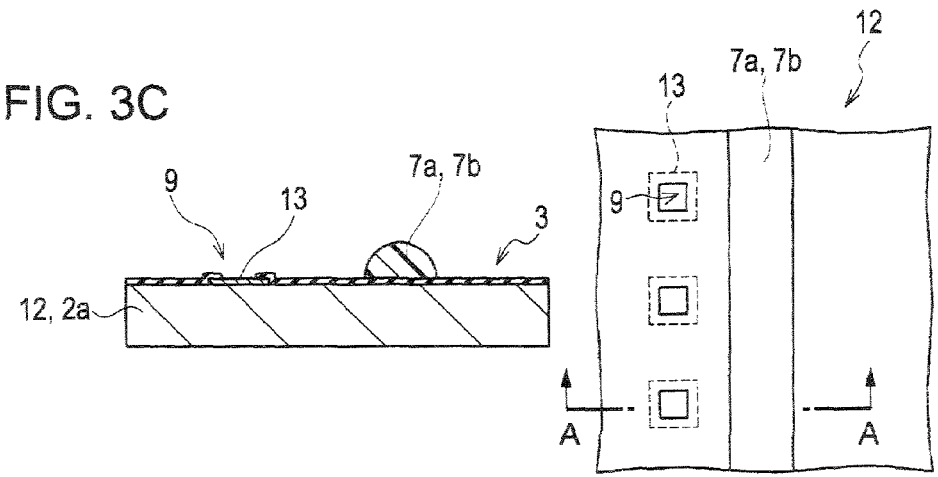

Next, as shown in FIG. 3B, a photosensitive material that becomes basis of the resin protrusion parts 7a and 7b (see FIG. 2), for example, an epoxy resin is coated on the active face 3 side in a predetermined depth by using a spin coating method. Subsequently, a patterning process is performed by exposing and developing the coated photosensitive epoxy resin for forming a long and thin resin protrusion part 7' having a rectangular cross section which is the original form of the resin protrusion parts 7a and 7b. Next, the resin protrusion parts 7a and 7b are formed, as shown in FIG. 3C, by hardening the resin protrusion part 7' and shaping its corner parts round by heating the resin protrusion part 7' at a predetermined temperature.

Figure 4D:
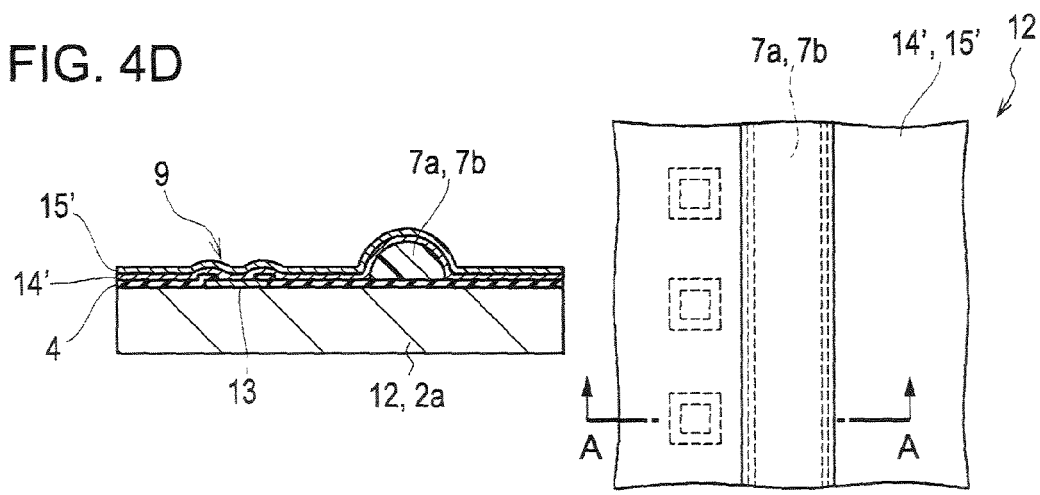
FIGS. 4D to 4F are schematic diagrams showing a method of forming terminals according to an embodiment of the invention.

Next, as shown in FIG. 4D, a first layer 14' as the underlying layer, for example, formed of TiW is formed to have a predetermined thickness on the entire face (the active face 3 side) of the wafer by using a sputtering method or the like. In addition, on the first layer, a second layer 15', for example, formed of Au is formed to have a predetermined thickness on the entire face of the wafer by using a sputtering method, a plating method, or the like. The first layer 14' is brought into contact in a face shape with the pad 13 in the opening 9 of the passivation film 4.

Figure 4E:
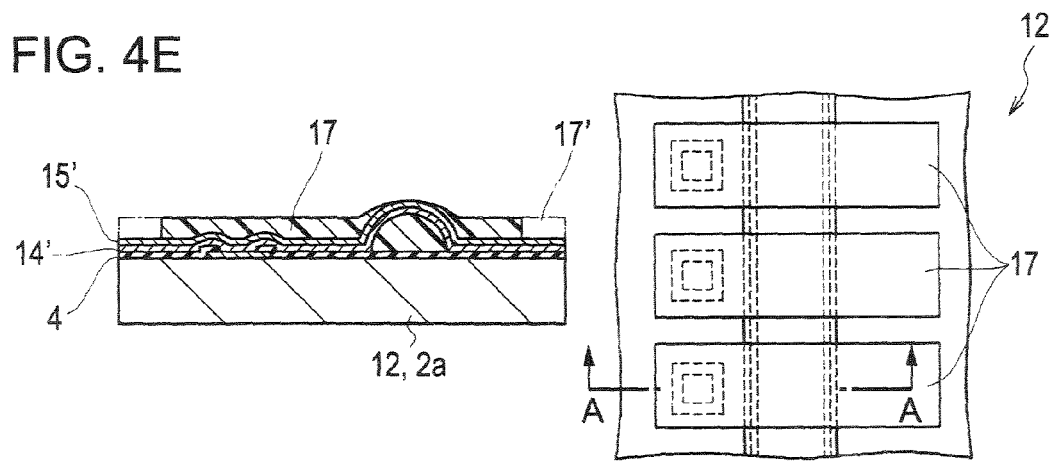

Next, as shown in FIG. 4E, a photosensitive resist material 17' is coated on the wafer in a predetermined thickness. In addition, by exposing and developing the resist material 17', a resist pattern 17 of a predetermined planar shape, that is, a planar shape that is the same as that of the conductive films 8a and 8b is formed.

Figure 4F:
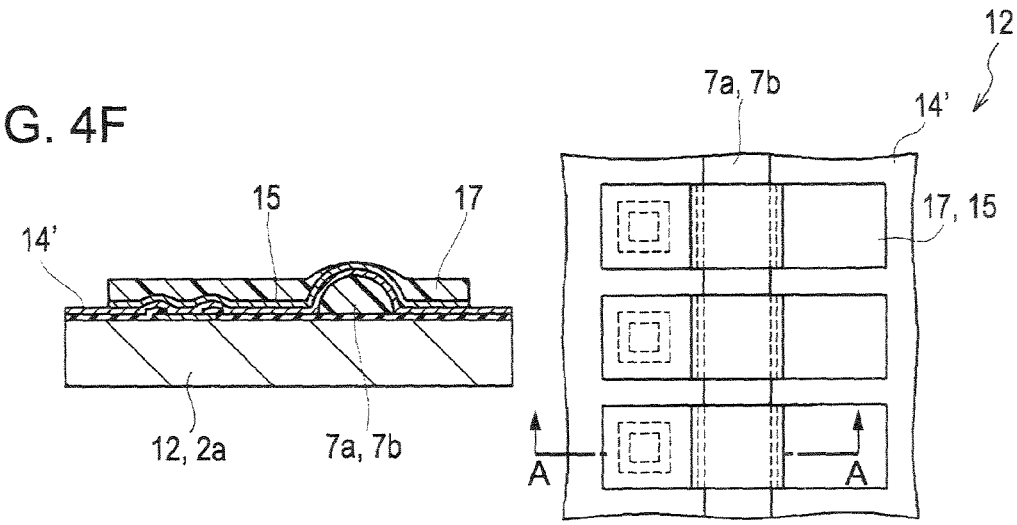
Figure 6A:
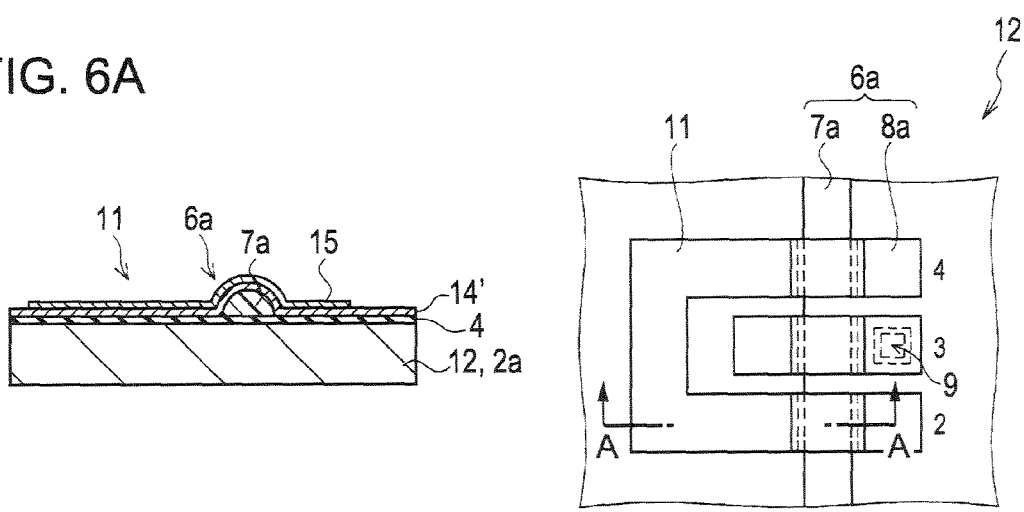
FIGS. 6A and 6B are schematic diagrams showing a method of forming a rewiring line according to an embodiment of the invention.

Next, the second layer 15 of a predetermined shape shown in FIG. 4F is formed by etching the second layer 15' by using the resist pattern 17 as a mask. At that moment, as shown in FIG. 6A, the second layer 15 of the rewiring line 11 that connects the terminals 6a of numbers 2 and 4 is simultaneously patterned.

Figure 5G:
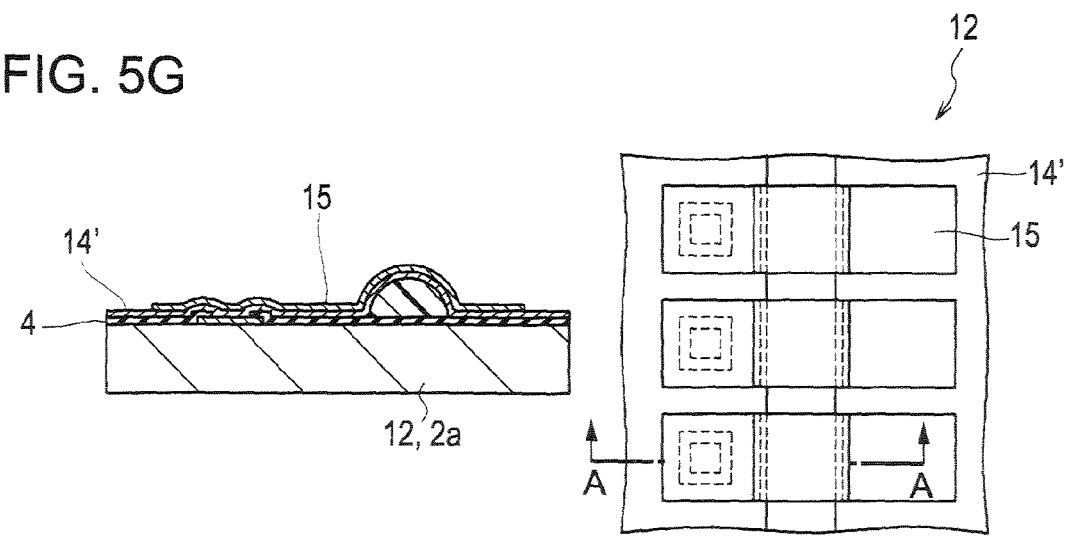
FIGS. 5G and 5H are schematic diagrams showing a method of forming terminals according to an embodiment of the invention.
Figure 5H:
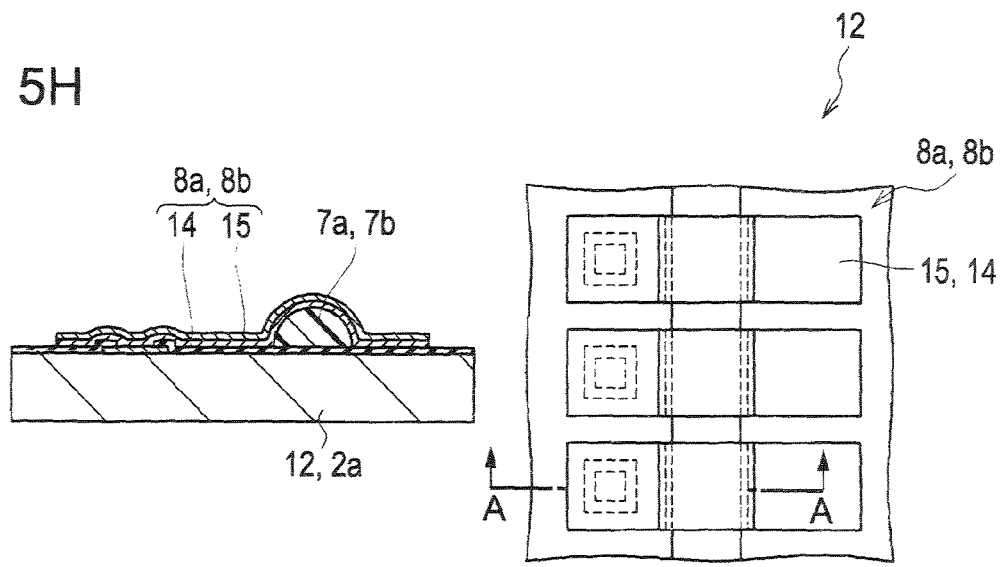
Figure 6B:
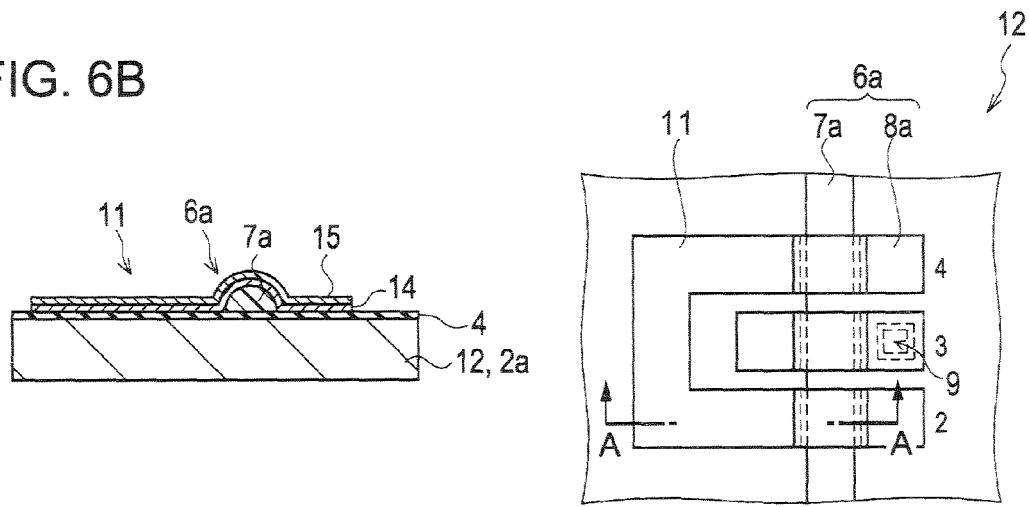

Next, as shown in FIG. 5G, the resist pattern 17 is removed by an appropriate peeling liquid. Then, a first layer 14 that has the same planar shape as that of the second layer 15 is formed as shown in FIG. 5H by etching a first layer 14' using a predetermined etching liquid with the patterned second layer 15 used as a mask. At this moment, as shown in FIG. 6B, the first layer 14 of the rewiring line 11 is simultaneous formed. As described above, a plurality of island-shaped conductive films 8a and 8b is formed on the active face 3 of the base substrate 2 shown in FIG. 2, and thus, a plurality of arranged terminals 6a and 6b is completed. In addition, simultaneously, the terminals 6a of numbers 2 and 4 and the rewiring line 11 are integrally formed.

In consideration of elastic deformation of the resin core bump and reliability of connection, it is preferable that the film thickness of first layer 14 of TiW is in the range of 30 nm to 100 nm and the film thickness or the second layer 15 of Au is in the range of 200 nm to 2000 nm. The thin film of the second layer 15 of the rewiring line 11 may not be the same as that of the terminal 6a. Since only wiring resistance for which electrical connection is enabled is needed to be acquired, and, for example, the film thickness may be formed thin. Accordingly, unnecessary use of Au can be prevented.

The IC chip 1 completed as above has the rewiring line 11 that connects the plurality of terminals 6a and 6b serving as the resin core bump on the active face 3 and the terminals of numbers 2 and 4 (dummy terminals) 6a among the plurality of the terminals 6a. When the IC chip 1 is mounted on a substrate, it is possible to electrically connect the wiring on the substrate by using the terminal 6a disposed in the IC chip 1 and the rewiring line 11 connected thereto.

Next, a method of mounting the IC chip shown in FIGS. 1 and 2 will be described.

Figure 7A:
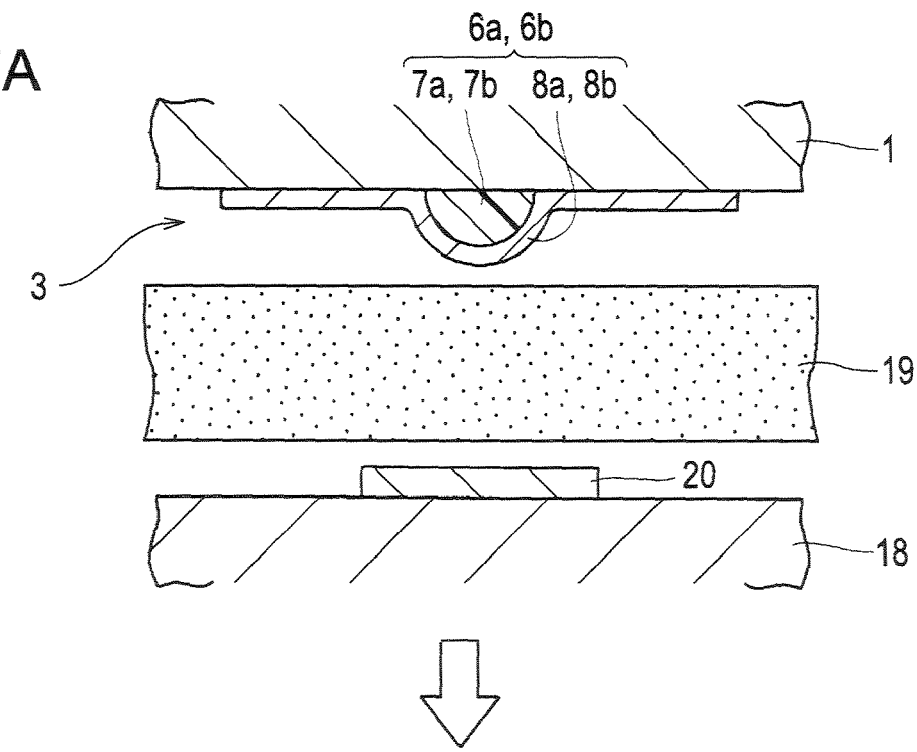
FIGS. 7A and 7B shows a conductive connection state between terminals (resin core bump) of a semiconductor device and terminals of a substrate according to an embodiment of the invention.
Figure 7B:
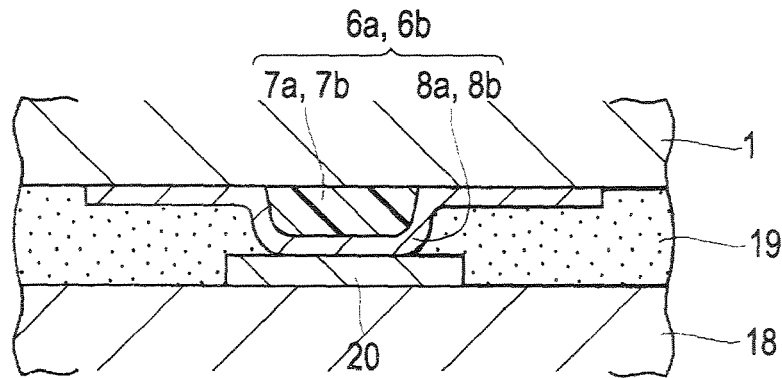

The IC chip 1 is mounted on the surface of a hard substrate formed of glass, a hard substrate formed of plastic, an FPC substrate having flexibility, or the like. At that moment, as shown in FIG. 7A, after a non conductive film (NCF) 19 that does not include conductive particles is inserted between the active face 3 side and a substrate 18 using an adhesive agent, the IC chip 1 is pressed to the substrate 18. Then, as shown in FIG. 7B, a terminal 20 on the substrate 18 side and the terminals 6a and 6b on the IC chip 1 side are brought into direct contact with each other. Then, when pressing is continued, the resin protrusion parts 7a and 7b are elastically deformed due to the pressing force to be in a flat state. The contact areas between the conductive films 8a and 8b and the opposing terminal 20 increase due to the elastic deformation of the resin protrusion parts 7a and 7b. In addition, the pressing force that presses the conductive films 8a and 8b and the terminal 20 each other becomes sufficiently large. As a result, a stable conductive contact state between the conductive films 8a and 8b and the terminal 20 can be acquired. The conductive contact state is achieved between all the terminals 6a and 6b on the IC chip 1 side and all the terminals 20 on the substrate side 18. Accordingly, the IC chip 1 can be mounted on the substrate 18 with high reliability.

The IC chip 1 may be mounted on the substrate 18 by using an anisotropic conductive film (ACF) as an adhesive agent. In such a case, the terminals 6a and 6b on the IC chip 1 side and the terminal 20 located on the substrate 18 side are conductively connected to each other by conductive particles that are included in the anisotropic conductive film in a dispersed state. Under this conductive connection structure, when the planar disposition pitch of the terminals 20 decreases, adjacent terminals 20 may be erroneously in a conductive state by the conductive particles. Thus, there is a possibility that a short circuit is formed. In addition, the rewiring line 11 on the IC chip 1 side and the terminal 20 on the substrate 18 side or the rewiring line 11 and a terminal 6a that is not connected to the rewiring line 11, for example, a terminal 6a of number 3 shown in FIG. 2 may be shorted due to the conductive particles.

On the other hand, in this embodiment, a structure in which conductive connection is acquired by direct contact between the terminals 6a and 6b on the IC chip 1 side and the terminals 20 on the substrate 18 side is used for using the non conductive film (NCF), and accordingly, formation of a short circuit between adjacent terminals is prevented. As a result, a wiring pattern of high precision can be disposed by decreasing the pitch of the terminals on the substrate 18.

The IC chip 1 according to this embodiment mounted on a hard substrate of glass, a hard substrate of plastic, or an FPC substrate having flexibility. Hereinafter, the substrate on which the IC chip 1 is mounted is referred to as a mounting substrate for descriptions. The mounting substrate may be a substrate of glass, a substrate of plastic, or an FPC substrate. In such a case, the input and output terminals 6a and 6b of the IC chip 1 are conductively connected to wirings on the mounting substrate. In FIG. 2, the input terminals 6a will be referred to as 1, 2, 3, 4, and 5 in order from the left side. The rewiring line 11 connects terminals of numbers 2 and 4 together. All the terminals of numbers 1 to 5 are conductively connected to the wirings on the mounting substrate.

Now, it is assumed that a general IC chip in which the rewiring line 11 is not disposed is used. Among the wirings on the mounting substrate, it is difficult to connect a wiring connected to the terminal of number 2 and a wiring connected to the terminal of number 4 together on the mounting substrate which are not adjacent, as long as wirings are disposed in parts of the inner areas of the terminals 6a and 6b of the IC chip 1 facing the active face 3 or the mounting substrate is a single-sided wiring of one layer in a case where the wirings are not disposed in the above-described areas. At least one reason for difficulty in implementing the above-described wiring is that a wiring connected to a terminal of number 3 is disposed between the wirings connected to the terminals of numbers 2 and 4 and a wiring (so-called a cross wiring) for crossing the wiring cannot be formed by patterning a single-sided wiring of one layer. When a cross wiring is to be implemented, the mounting substrate is, for example, configured to use a double-sided wiring, and a cross wiring is needed to be formed on the rear face of the major wiring. However, the double-sided wiring causes remarkable cost-up, and is not practical. In addition, a case where a multi-layered wiring is employed on one side of the mounting substrate causes the same problem.

On the other hand, in this embodiment, since the terminals 2 and 4 that are not adjacent are connected by the rewiring line 11 of the IC chip 1, the wirings connected to the terminals 2 and 4 on the mounting substrate are in a conductive state through the rewiring line 11 in a case where the IC chip 1 is mounted on the mounting substrate. As a result, although the wirings for the terminals 2 and 4 are not cross-wired on the mounting substrate at all, the wirings are substantially cross wired through the rewiring line 11 on the IC chip 1. Accordingly, a substantial cross wiring can be implemented for the mounting substrate having single-sided wiring of one layer without using a double-sided wiring or a multi-layered one-side wiring for the mounting substrate. Therefore, the degree of freedom of wiring design can be markedly improved with the manufacturing cost of the mounting substrate maintained to be low. In addition, the precision of circuit design can be improved markedly.

Second Embodiment of Semiconductor Device

Figure 8:
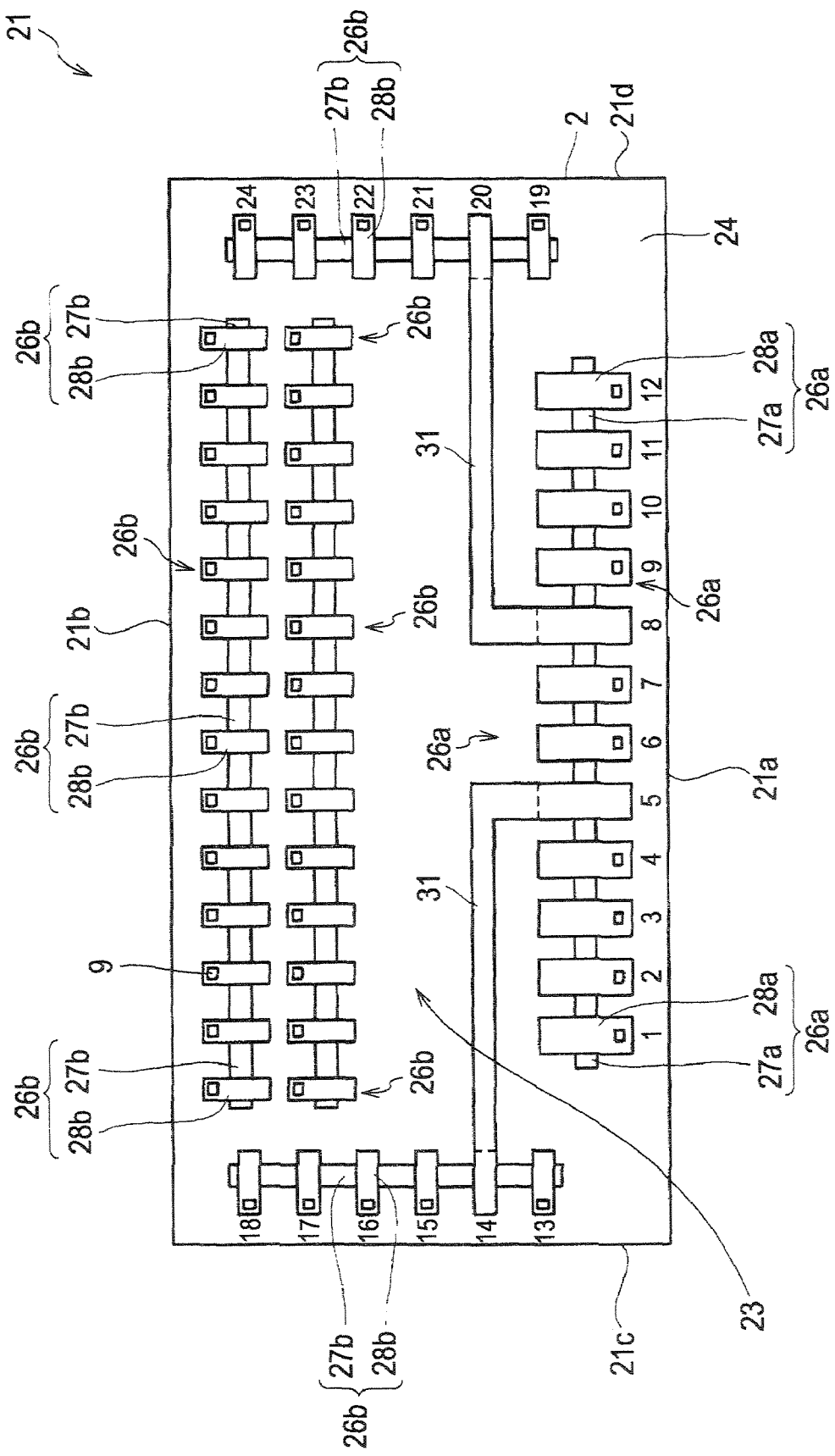
FIG. 8 is a plan view of a semiconductor device according to another embodiment of the invention.

FIG. 8 is a schematic plan view showing a semiconductor device according to another embodiment of the invention. In the figure, an active face 23 of an IC chip 21 as the semiconductor device is shown two-dimensionally. The entire active face 23 is coated with a passivation film 24. On the passivation film 24, a plurality of input terminals 26a and a plurality of output terminals 26b are disposed. The plurality of input terminals 26a is disposed to be aligned in a straight line shape along one longer side 21a (on the lower side in the figure) between a pair of longer sides of the IC chip 21 that face each other. The plurality of output terminals 26b is disposed to be aligned in straight line shapes along the other longer side 21b (the upper side in the figure) in two rows and is disposed to be aligned in straight lines along one pair of shorter sides 21c and 21d of the IC chip 21 which face each other.

Each of the input terminals 26a is configured by a terminal part of a long and thin resin protrusion part 27a and an island-shaped conductive film 28a. Each of the output terminals 26b is configured by a terminal part of a long and thin resin protrusion part 27b and an island-shaped conductive film 28b. The configuration of each of the resin protrusion parts 27a and 27b is the same as that of the resin protrusion parts 7a and 7b shown in FIGS. 1 and 2, and thus, a description thereof is omitted here. In addition, one configuration of each of the conductive films 28a and 28b is the same as that of the conductive films 8a and 8b shown in FIGS. 1 and 2, and thus, a description thereof is omitted here.

In an area surrounded by the plurality of the terminals 26a and 26b which is located on the passivation film 24 of the active face 23, rewiring lines 31 are formed. Forming the rewiring lines 31 on the active face 23 side is the same as forming the rewiring line 11 on the active face 3 side in the previous embodiment shown in FIG. 2. In addition, a method of forming the rewiring lines 31 shown in FIG. 8 is the same as that of forming the rewiring line 11 shown in FIG. 2. In the first embodiment described above, the input terminals 6a are connected together with the rewiring line 11. However, in this embodiment shown in FIG. 8, an input terminal 26a of number 5 and an output terminal 26b of number 14 are connected together with the rewiring line 31. In addition, an input terminal 26a of number 8 and an output terminal 26b of number 20 are connected together with the rewiring line 31. In this embodiment, both of the terminals are formed as dummy terminals that are not connected to an internal circuit. However, the terminals may be configured as actual terminals used for transmission of signals.

The IC chip 21 according to this embodiment is mounted on a mounting substrate, which is a substrate positioned on the opposite side, in a state that a non conductive film (NCF) is inserted therein. At that moment, a main body of the IC chip 21 and a main body of the mounting substrate are bonded together by the non conductive film (NCF). Accordingly, the terminals 26a and 26b of the IC chip 21 and the terminals of the mounting substrate are in an electrical conductive state by being brought into direct contact with each other under appropriate pressure. In this embodiment, as in the above-described first embodiment shown in FIG. 2, erroneous conduction between adjacent terminals can be prevented well and a wiring pattern of high precision can be acquired, compared to a case where an anisotropic conductive film (ACF) is used.

When the IC chip 21 according to this embodiment is mounted on the mounting substrate, the input terminals 26a and the output terminals 26b of the IC chip 21 are conductively connected to the wirings on the mounting substrate. In FIG. 8, the input terminals 26a are denoted by numbers 1 to 12 in order form the left side in the figure, and the output terminals 26b disposed along the shorter side 21c on the left side are denoted by numbers 13 to 18 in order from the bottom in the figure. Likewise, the output terminals 26b disposed along the shorter side 21d on the right side are denoted by numbers 19 to 24 from the bottom in the figure. The rewiring line 31 disposed on the left side of the figure connects the input terminal of number 5 and the output terminal of number 14 together. In addition, the rewiring line 31 disposed on the right side of the figure connects the input terminal of number 8 and the output terminal of number 20 together. All the terminals of numbers 1 to 24 are conductively connected to the wirings on the mounting substrate.

Now, when a general IC chip in which the rewiring line 31 is not disposed is considered, it is difficult to connect a wiring (hereinafter, referred to as a terminal wiring of number 5) connected to an input terminal of number 5 and a wiring (hereinafter, referred to as a terminal wiring of number 14) connected to an output terminal of number 14, among the wirings on the mounting substrate, together on the mounting substrate, as long as wirings are disposed in parts of the inner areas of the terminals 6a and 6b of the IC chip 1 facing the active face 3 or the mounting substrate is a single-sided wiring of one layer in a case where the wirings are not disposed in the above-described areas. At least one reason for difficulty in implementing the above-described wiring is that input terminal wirings of numbers 1 to 4 and an output terminal wiring of number 13 are disposed between the input terminal wiring of number 5 and the output terminal wiring of number 14, and a wiring (so-called a cross wiring) for crossing the terminal wirings cannot be formed by patterning a single-sided wiring of one layer. When a cross wiring is to be implemented, the mounting substrate is, for example, configured to use a double-sided wiring, and a cross wiring is needed to be formed on the rear face of the major wiring. However, the double-sized wiring causes remarkable cost-up, and is not practical.

On the other hand, in this embodiment, since the input terminal of number 5 and the output terminal of number 14 are connected by the rewiring line 31 of the IC chip 21, the input terminal wiring of number 5 and the output terminal wiring of number 14 are in a conductive state through the rewiring line 31 on the mounting substrate in a case where the IC chip 21 is mounted on the mounting substrate. As a result, although the terminal wiring of number 5 and the terminal wiring of number 14 are not cross-wired on the mounting substrate at all, the terminal wirings are substantially cross wired through the rewiring line 31 on the IC chip 21. This applies the same for the terminal wirings of numbers 8 and 20 connected through the rewiring line 31 disposed on the right side in FIG. 8. Accordingly, a substantial cross wiring can be implemented for the mounting substrate having single-sided wiring of one layer without using a double-sided wiring or a multi-layered one-side wiring for the mounting substrate. Therefore, the degree of freedom of wiring design can be markedly improved with the manufacturing cost of the mounting substrate maintained to be low. In addition, the precision of circuit design can be improved remarkably.

First Embodiment of Semiconductor Mounting Structure

Figure 9:
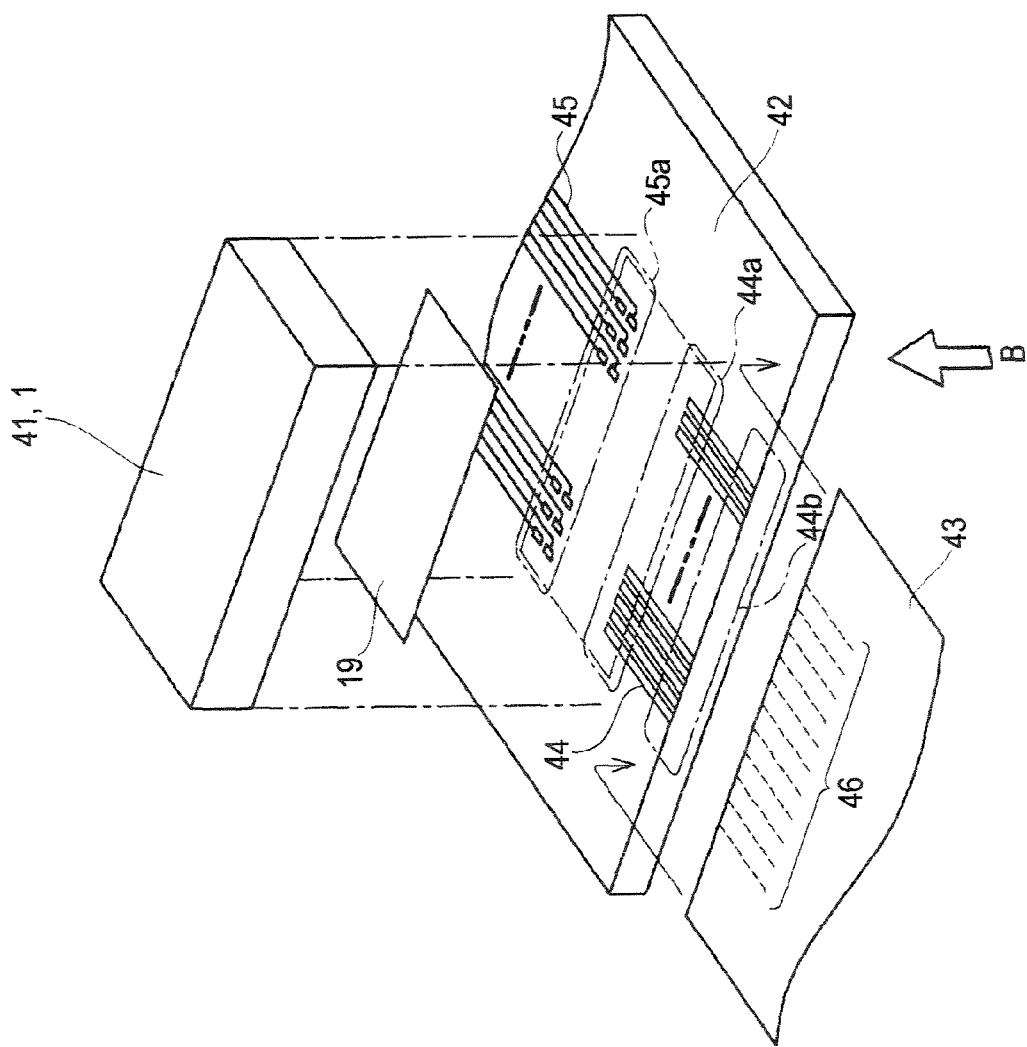
FIG. 9 is an exploded perspective view showing a semiconductor mounting structure according to an embodiment of the invention.

Hereinafter, a semiconductor mounting structure according to an embodiment of the invention will be described. The semiconductor mounting structure is a structure formed by mounting a semiconductor device on a substrate using an adhesive agent. FIG. 9 is an exploded perspective view showing the semiconductor mounting structure.

As shown in FIG. 9, the semiconductor mounting structure according to this embodiment is an example in which an IC chip 41 as a semiconductor device is mounted on a first substrate 42 by using a non conductive film (NCF) 19 and a second substrate 43 is connected to the first substrate 42.

The first substrate 42 and the second substrate 43 are, for example, connected together by an anisotropic conductive film (ACF). It is assumed that the IC chip 41 is the same as the IC chip 1 shown in FIGS. 1 and 2.

The first substrate 42 is a non-flexible hard substrate formed of glass or plastic. The second substrate 43 is a thin flexible FPC substrate. On the first substrate 42, as first wirings, a plurality of input wirings 44 and a plurality of output wirings 45 are formed as first wirings by a photo etching process. Front end parts of the wirings 44 and 45 are configured as connection terminals to which other wirings are connected.

On the second substrate 43, a plurality of wirings 46 as second wirings is formed by a photo etching process.

A connection terminal group 44a of the input wirings 44 of the first substrate 42 on one side which is connected to the plurality of terminals of the IC chip 41 and a connection terminal group 45a of the output wirings 45 configure a first connection terminal group. In addition, a connection terminal group 44b of the input wirings 44 on the other side which is connected to the plurality of wirings 46 of the second substrate 43 configures a second connection terminal group that is connected to the first connection terminal group.

Figure 10:
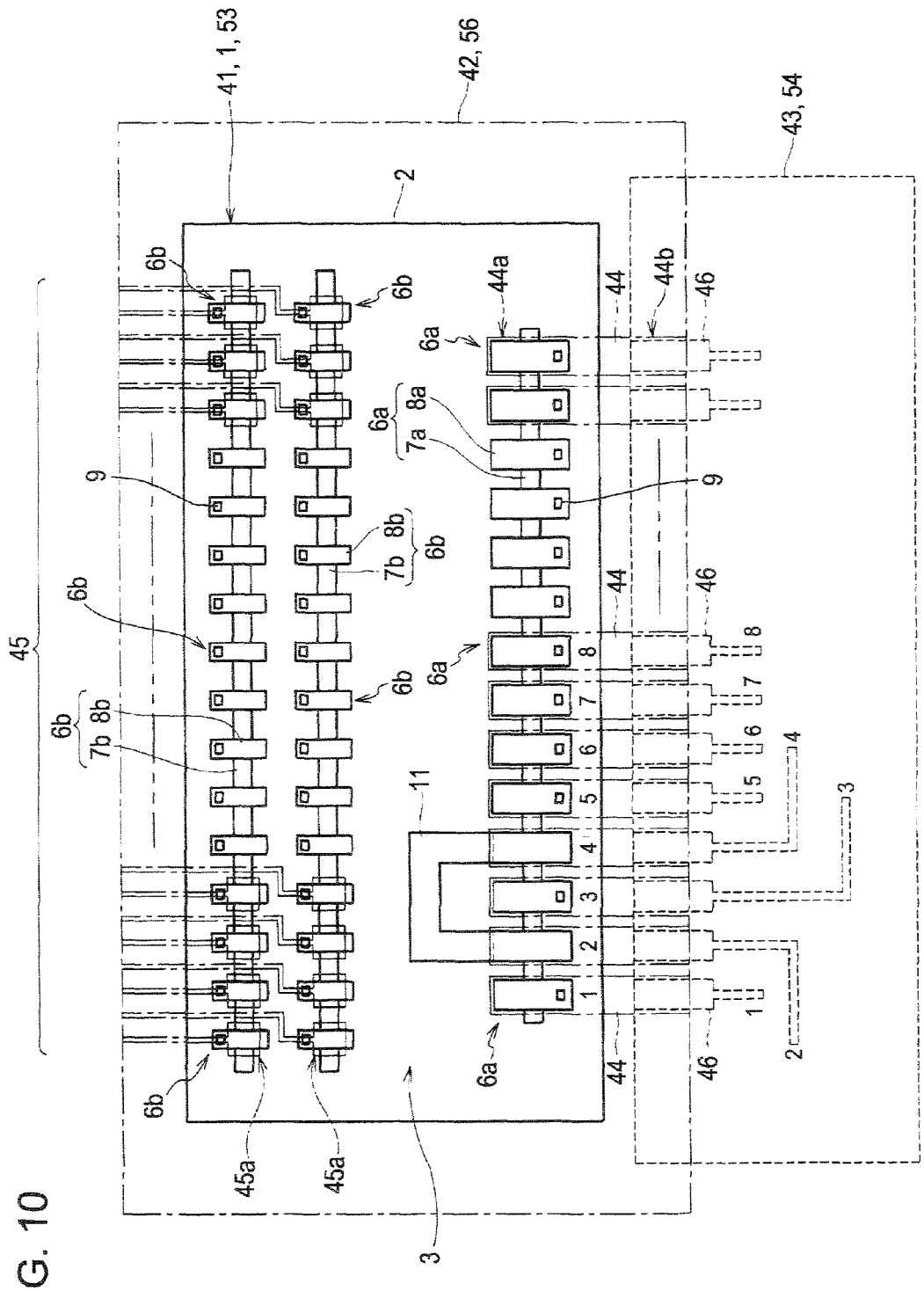
FIG. 10 is a plan view showing the semiconductor mounting structure.

FIG. 10 is a plan view showing the semiconductor mounting structure of FIG. 9 viewed from direction B denoted by an arrow shown in FIG. 9. In particular, FIG. 10 shows a state of the semiconductor mounting structure viewed from the rear side of the first substrate 42, and particularly shows a connection state of terminals of the IC chip 41, wirings 44 and 45 (first wirings) on the first substrate 42, and wirings 46 (second wirings) on the second substrate 43. In addition, in an inner area of the terminals 6a and 6b of the IC chip 1, on the first substrate 42 facing the active face 3, a plurality of wirings (not shown) is formed. As shown in FIG. 10, to the output terminals 6b of the IC chip 41, the connection terminal group 45a of the output wirings 45 on the first substrate 42 is connected. In addition, to the input terminals 6a of the IC chip 41, the connection terminal group 44a of the input wirings 44, which are disposed on the first substrate 42, on one side is connected. In addition, to the connection terminal group 44b of the input wirings 44, which are disposed on the first substrate 42, on the other side, terminals of wirings 46 on the second substrate 43 are connected. Here, the input terminals 6a of the IC chip 41 are denoted by 1, 2, 3, 4, 5, ... in order from the left side in the figure. In addition, the wirings 46 on the second substrate 43 are denoted by 1, 2, 3, 4, 5, ... in order from the left side in the figure. The rewiring line 11 formed on the active face 3 side of the IC chip 41 connects the terminals of numbers 2 and 4 of the IC chip 41 which are not adjacent to each other to be in a conductive state. In this embodiment, both the terminals are formed as dummy terminals that are not connected to the internal circuit.

Figure 11:
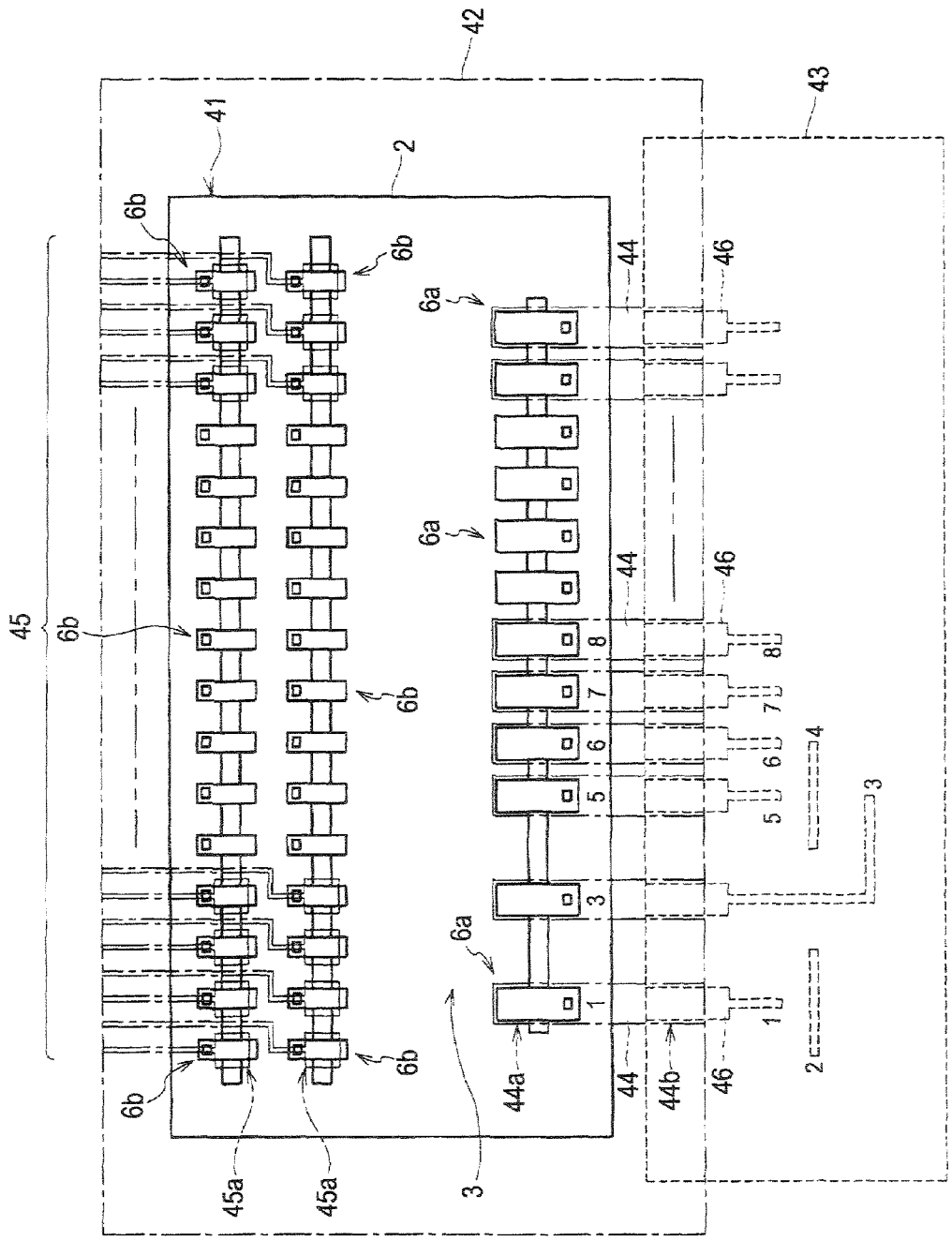
FIG. 11 is a plan view showing a general circuit configuration of a second substrate.

The general circuit configuration of the second substrate 43 is as shown in FIG. 11, and the wirings of numbers 2 and 4 disposed with a wiring of number 3 interposed therebetween serve as unique signal transmission lines. When the wirings of numbers 2 and 4 are needed to be connected together, in a general case, a wiring of number 3 between the wirings of numbers 2 and 4 is disposed or other wirings are disposed in an area located on the inner side of the terminals 6a and 6b of the IC chip 41 facing the active face 3. Accordingly, line connection cannot be formed in a single-sided wiring of one layer. Thus, the line connection is needed to be implemented, for example, by a double-sided wirings. In particular, the wirings of numbers 2 and 4 are needed to be connected by using a cross wiring by forming the cross wiring on the rear face opposite to the main face in which the wirings 46 are formed. However, the double-sided wiring incurs a remarkable cost up and is not practical.

However, in this embodiment, as shown in FIG. 10 the wirings of numbers 2 and 4 on the second substrate 43 are connected to the terminals of numbers 2 and 4 of the IC chip 41, and the terminals of numbers 2 and 4 are connected together through the rewiring line 11 on the active face 3 of the IC chip 41. As a result, although the second substrate 43 is configured as a single-sided wiring of one layer, the wirings of numbers 2 and 4 can be substantially cross-wired by using the rewiring line 11. Accordingly, the degree of freedom of wiring design of the second substrate 43 can be improved without causing cost up.

In addition, since the IC chip 41 and the first substrate 42 are bonded together by using the NCF 19, the plurality of the terminals 6a and 6b and the first connection terminal group are bonded together without generating a short circuit between the terminals.

Second Embodiment of Semiconductor Mounting Structure

Figure 12:
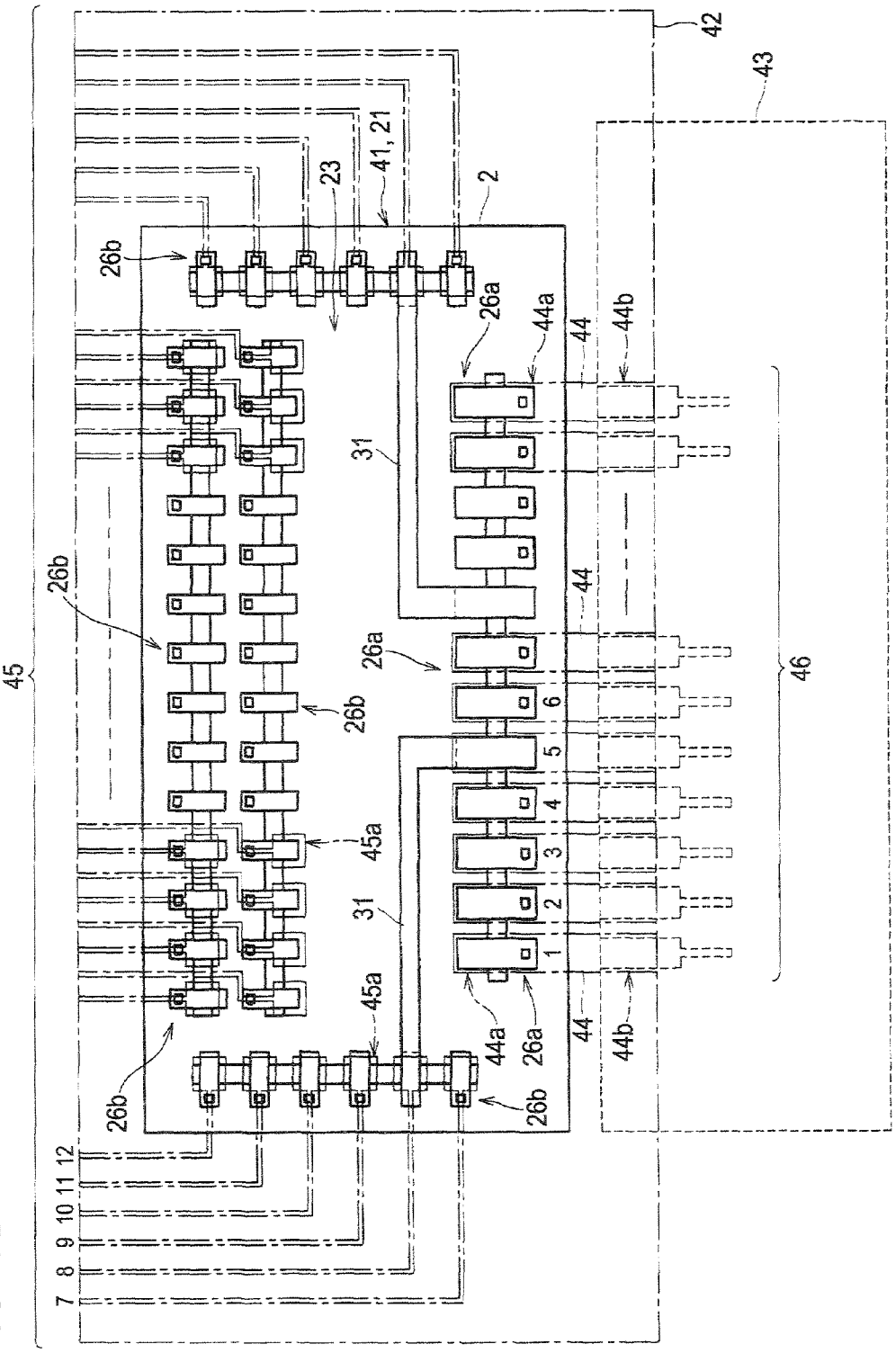
FIG. 12 is a plan view showing a semiconductor mounting structure according to another embodiment of the invention.

FIG. 12 is a plan view showing a semiconductor mounting structure according to another embodiment of the invention. In this embodiment, as shown in FIG. 9, an example in which an IC chip 41 as a semiconductor device is mounted on a first substrate 42 by using a non-conductive film (NCF) 19 and a second substrate 43 is connected to the first substrate 42 is represented. The first substrate 42 and the second substrate 43 are, for example, connected together with an anisotropic conductive film (ACF). It is assumed that the IC chip 41 is the same as the IC chip 21 shown in FIG. 8.

On the first substrate 42 that is a non-flexible hard substrate formed of glass or plastic, a plurality of input wirings 44 and a plurality of output wirings 45 are formed as first wirings by a photo etching process. Front end parts of the wirings 44 and 45 are configured as connection terminals to which other wirings are connected. In the inner area of the terminals 26a and 26b of the IC chip 21, a plurality of wirings (not shown) is formed on the first substrate 42 facing an active face 23. On the second substrate 43 that is a flexible FPC substrate, a plurality of wirings 46 is formed as second wirings by a photo etching process.

To the output terminals 26b of the IC chip 41, the connection terminal group 45a of the output wirings 45 on the first substrate 42 is connected. In addition, to the input terminals 26a of the IC chip 41, a connection terminal group 44a of the input wirings 44, which are disposed on the first substrate 42, on one side is connected. In addition, to a connection terminal group 44b of the input wirings 44, which are disposed on the first substrate 42, on the other side, terminals of wirings 46 on the second substrate 43 are connected. Here, the input terminals 26a of the IC chip 41 are denoted by 1, 2, 3, 4, 5, and 6 in order from the left side in the figure. In addition, among the wirings 45 disposed on the first substrate 42, the wirings 45 extending from the left end side of the IC chip 41 are denoted by 7, 8, 9, 10, 11, and 12 in order from the left side in the figure. The rewiring line 31 formed on the active face 23 of the IC chip 41 connects the input terminal of number 5 of the IC chip 41 and the output terminal connected to the wiring of number 8 on the first substrate 42 to be in a conductive state. In this embodiment, both the terminals are formed as dummy terminals that are not connected to the internal circuit.

When the first substrate 42 is a hard substrate formed of glass or the like, it is difficult to form double-sided wirings in the first substrate 42. Thus, commonly, a single-sided wiring form of one layer is employed in the first substrate 42. In such a case, generally a wiring for connecting the input terminal of number 5 of the IC chip 41 and the wiring of number 8 on the first substrate 42 cannot be formed. The reason is that wirings 44 connected to the input terminals 26a of numbers 1 to 4 and the wiring of number 7 are disposed between the terminal of number 5 and the wiring of number 8 on the first substrate 42, and other wirings are disposed in an inner area of the terminals 26a and 26b of the IC chip 41 facing the active face 3. Accordingly, the terminals of numbers 5 and 8 cannot be cross-wired together.

However, in this embodiment, as shown in FIG. 12, the input terminal of number 5 of the IC chip 41 and the terminal 26b connected to the wiring of number 8 on the first substrate 42 are connected together with the rewiring line 31 formed on the active face 23 of the IC chip 41 to be in a conductive state. As a result although the first substrate 42 is configured as a single-sided wiring of one layer, the wirings of number 8 and the terminal of number 5 can be substantially cross-wired through the rewiring line 31 by mounting the IC chip 41 on the first substrate 42. Accordingly, the degree of freedom of wiring design of the first substrate 42 can be improved without causing cost up.

In addition, since the IC chip 41 and the fist substrate 42 are bonded together by using the NCF 19, the plurality of the terminals 26a and 26b and the first connection terminal group are bonded together without generating a short circuit between the terminals.

First Embodiment of Electro-Optical Device

Figure 13:
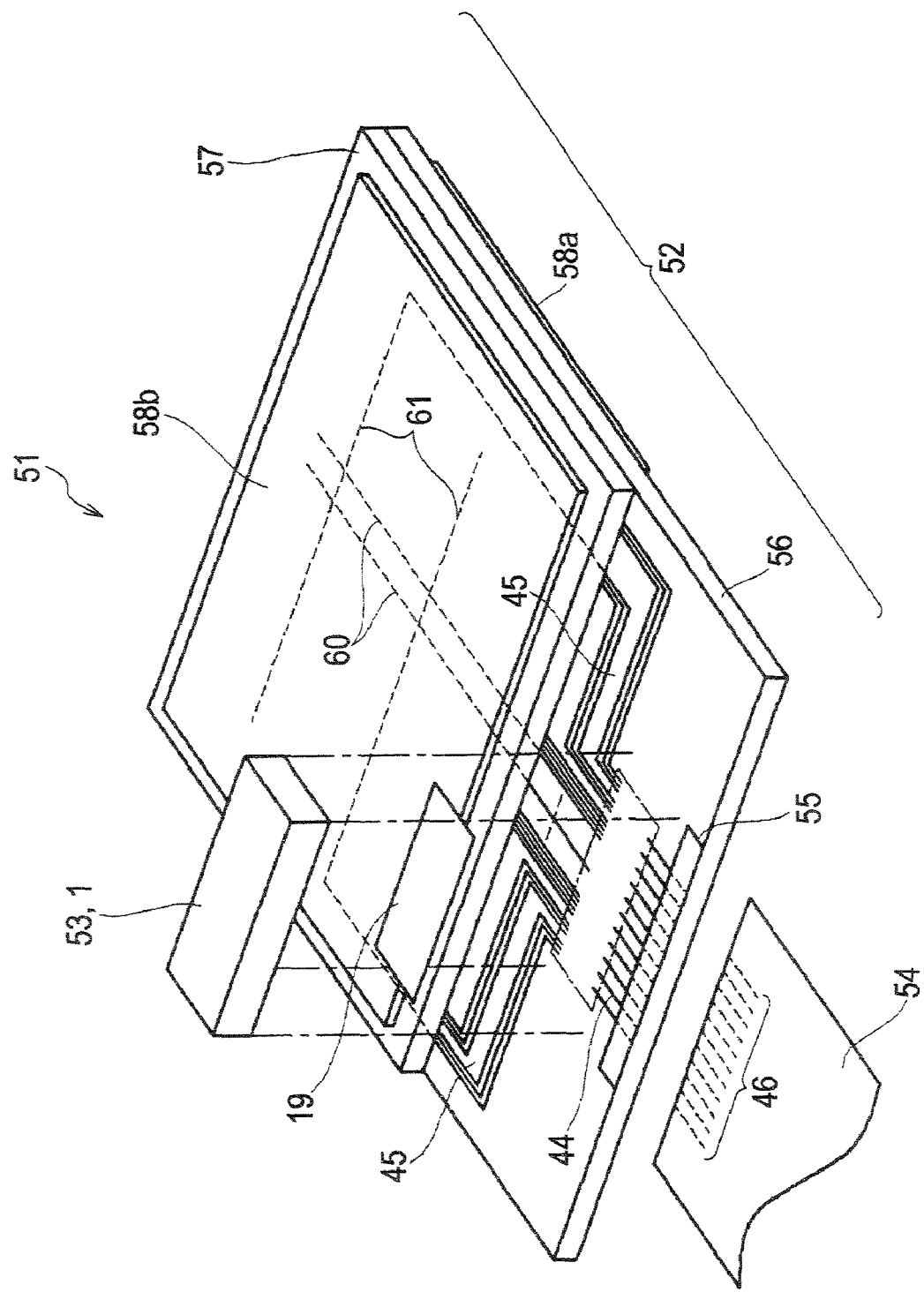
FIG. 13 is an exploded perspective view showing a liquid crystal device as an electro-optical device according to an embodiment of the invention.

Hereinafter, an electro-optical device according to an embodiment of the invention will be described. FIG. 13 is an exploded perspective view showing a liquid crystal device as the electro-optical device. As shown in FIG. 13, the liquid crystal device 51 as the electro-optical device according to this embodiment includes a liquid crystal panel 52 as an electro-optical panel, a driving IC 53 as a semiconductor device installed in the liquid crystal panel 52 by using a non-conductive film (NCF) 19, and an FPC substrate 54 as a second substrate connected to the liquid crystal panel 52 by using an anisotropic conductive film (ACF) 55.

The liquid crystal panel 52 has a first substrate 56 and a third substrate 57 that face each other. To the outer face of the first substrate 56, a first polarizing plate 58a is attached. In addition, to the outer face of the third substrate 57, a second polarizing plate 58b is attached. These polarizing plates are optical elements used for selectively transmitting polarized light. In addition, the transmission axis of the first polarizing plate 58a for polarized light and the transmission axis of the second polarizing plate 58b for polarized light intersect each other at an appropriate angle (for example, 90 degrees). The first substrate 56 and the third substrate 57 are attached together in peripheral areas thereof by using a sealing member (not shown). Between the substrates, a gap, for example, of about 5 μm, that is, so called a cell gap is formed. In addition, liquid crystal as an electro-optical material is inserted and sealed in the cell gap so as to configure a liquid crystal layer. The first and third substrates 56 and 57 are non-flexible hard substrates that are formed of translucent glass or translucent plastic. The first substrate 56 has a lead-out part (terminal part) that is extracted outside the third substrate 57, and a driving IC 53 is mounted on the lead-out part (terminal part). In this embodiment, a semiconductor mounting structure is configured by the driving IC 53, the non-conductive film (NCF) 19, and the first substrate 56.

The liquid crystal panel 52 is driven by using any liquid crystal driving method such as a simple matrix method or an active matrix method. In addition, as the operation mode of the liquid crystal panel 52, any operation mode such as a TN (Twisted Nematic) mode, an STN (Super Twisted Nematic) mode, a VA (Vertical Aligned Nematic: vertical alignment), an ECB (Electrically Controlled Birefringence: electric-field controlled birefringence), an IPS (In-Plain Switching) mode, or an FFS (Fringe Field Switching) mode can be selected to be used. In addition, the liquid crystal panel 52 may employ any light collecting method such as a reflection type, a transmission type or a semi-transmission reflection type. In the semi-transmission reflection type, a reflection type and a transmission type can be selectively used as is needed by using a part of pixels as a reflection area and the other part as a transmission area. When a liquid crystal panel of the transmission type or the semi-transmission reflection type is configured, an illumination device (not shown) is additionally installed to the liquid crystal panel 52.

In the simple matrix method, each pixel does not include an active element, intersections of scanning electrodes and data electrode correspond to pixels or dots and a driving signal is directly applied. As an operation mode appropriately used for this simple matrix method, a TN mode, an STN mode, a VA mode, an ECB mode, or the like may be used.

In the active matrix method, an active element is provided for each pixel or dot, a data voltage is written by turning on the active element during a writing period, and the voltage is maintained by turning off the active element during the other period. The active element used in this active matrix method may be a three-terminal type or a two-terminal type. As an active element of the three-terminal type, for example, there is a TFT (Thin Film Transistor). As an active element of the two-terminal type, for example, there is an TFD (Thin Film Diode).

When the liquid crystal panel using an active matrix method, in which the TFT element is used as the active element (switching element), is used as the liquid crystal panel 52, a plurality of straight line-shaped data lines 60 extending in the direction perpendicular to the longitudinal direction of the lead-out part of the first substrate 56 and a plurality of straight line-shaped scanning lines 61 that are disposed to be perpendicular to the data lines 60 are disposed inside the liquid crystal panel 52. The data lines 60 and the scanning lines 61 are disposed on the first substrate 56 with an insulation layer interposed therebetween. On the lead-out part of the first substrate 56 input wirings 44 and output wirings 45 are formed by a photo etching process. The output wirings 45 that are disposed on the center area are connected to the data lines 60. In addition, the output wirings 45 that are disposed on the left and right end areas are connected to the scanning lines 61.

Near each of the intersections of the data lines 60 and the scanning lines 61, a TFT element is disposed. The data line 60 is, for example, connected to a source of the TFT element, and the scanning line 61 is connected to a gate of the TFT element. Inside each micro region surrounded by the data lines 60 and the scanning lines 61, a dot shaped, that is, an island-shaped pixel electrode is formed by a translucent metal oxide film such as ITO (Indium Tin Oxide), IZO (Indium Zinc Oxide), or the like. The pixel electrode is connected to a drain of the TFT element. On the surface of the third substrate 57 facing the first substrate 56 on the liquid crystal side, a common electrode in the shape of a sheer is disposed. A plurality of micro regions in which the dot-shaped pixel electrodes and the sheet-shaped common electrodes are overlapped with each other in a case where the liquid crystal panel 52 is viewed two dimensionally is formed in the shape of a dot matrix. The micro regions are areas used for forming pixels.

On the FPC substrate 54 that is the second substrate, circuit components and wirings are formed in a single-sided mounting state. In particular, a plurality of wirings 46 is formed on one face that is located on the rear side of a face shown in the figure, and circuit components (not shown) are mounted on the same rear face. As the circuit components, a resistor, a capacitor, a coil, an IC, and the like are used. When the FPC substrate 54 is connected to the end of the side of the first substrate 56, the input wirings 44 on the first substrate 56 are conductively connected to the wirings 46 on the FPC substrate 54 side.

The driving IC 53 according to this embodiment is formed by the IC chip 1 shown in FIGS. 1 and 2. The connection state or wirings in the semiconductor mounting structure configured by the driving IC 53, the non-conductive film 19 and the first substrate 56 is as shown in FIG. 10. In FIG. 10, reference symbols enclosed in parentheses represent corresponding components shown in FIG. 13. As shown in FIG. 10 wirings of numbers 2 and 4 disposed on the FPC substrate 54 are connected to terminals of numbers 2 and 4 of the driving IC 53, and the terminals of numbers 2 and 4 are connected together on the active face 3 of the driving IC 53 by a rewiring line 11. As a result, although the FPC substrate 54 has a single-sided wiring form of one layer, the wirings of numbers 2 and 4 can be substantially cross-wired by using the rewiring line 11. Accordingly, the degree of freedom on wiring design of the FPC substrate 54 can be improved with incurring cost up.

In this embodiment, although the input terminals of numbers 2 and 4 of the driving IC 53 are connected with the rewiring line 11, the terminals connected with the rewiring line 11 are not limited to the terminals of numbers 2 and 4. In addition, as is needed, the number of the terminals connected with the rewiring line 11 may be configured to be three or more.

In addition, the driving IC 53 may be formed by the IC chip 21 shown in FIG. 8. In other words, as is needed, the input terminal 6a and the output terminal 6b may be configured to be connected with the rewiring line 31. For example, when a detection circuit such as an optical sensor or a temperature sensor other than a circuit configuration for controlling driving of the liquid crystal layer is disposed on a part of the first substrate 56 of the liquid crystal panel 52, the input terminal 6a, the output terminal 6b, and the rewiring line 31 connected thereto may be used as a method of connecting the detection circuit and a wiring 46 of the second substrate 54 serving as a relay substrate.

In any case, it is effective to dispose the rewiring line 11 or 31 on the active face side so as to connect terminals that are not adjacent (neighboring) to each other.

In addition, the electro-optical device to which the semiconductor mounting structure according to this embodiment can be applied is not limited to the liquid crystal device 51. For example, the semiconductor mounting structure may be applied to an organic EL (electro luminescence) device, an inorganic EL device, a plasma display device (PDP), an electrophoretic display (EPD), and a field emission display device (FED). By applying the semiconductor mounting structure, a low-cost electro-optical device that has a simple configuration can be provided.

The electro-optical device according to this embodiment may be used as a constituent element of various electronic apparatuses. Preferably, the electro-optical device may be used as a display device of an electronic apparatus for displaying an image.

As the electronic apparatus, for example, there are a cellular phone, a personal digital assistant (PDA), a personal computer, a liquid crystal TV set, a view-finder type or a monitor direct-viewing type video cassette recorder, a car navigation system, a pager, an electronic diary, a calculator, a word processor, a workstation, a video telephone device, a POS terminal, a digital still camera, an electronic boot, and the like.

Figure 14:
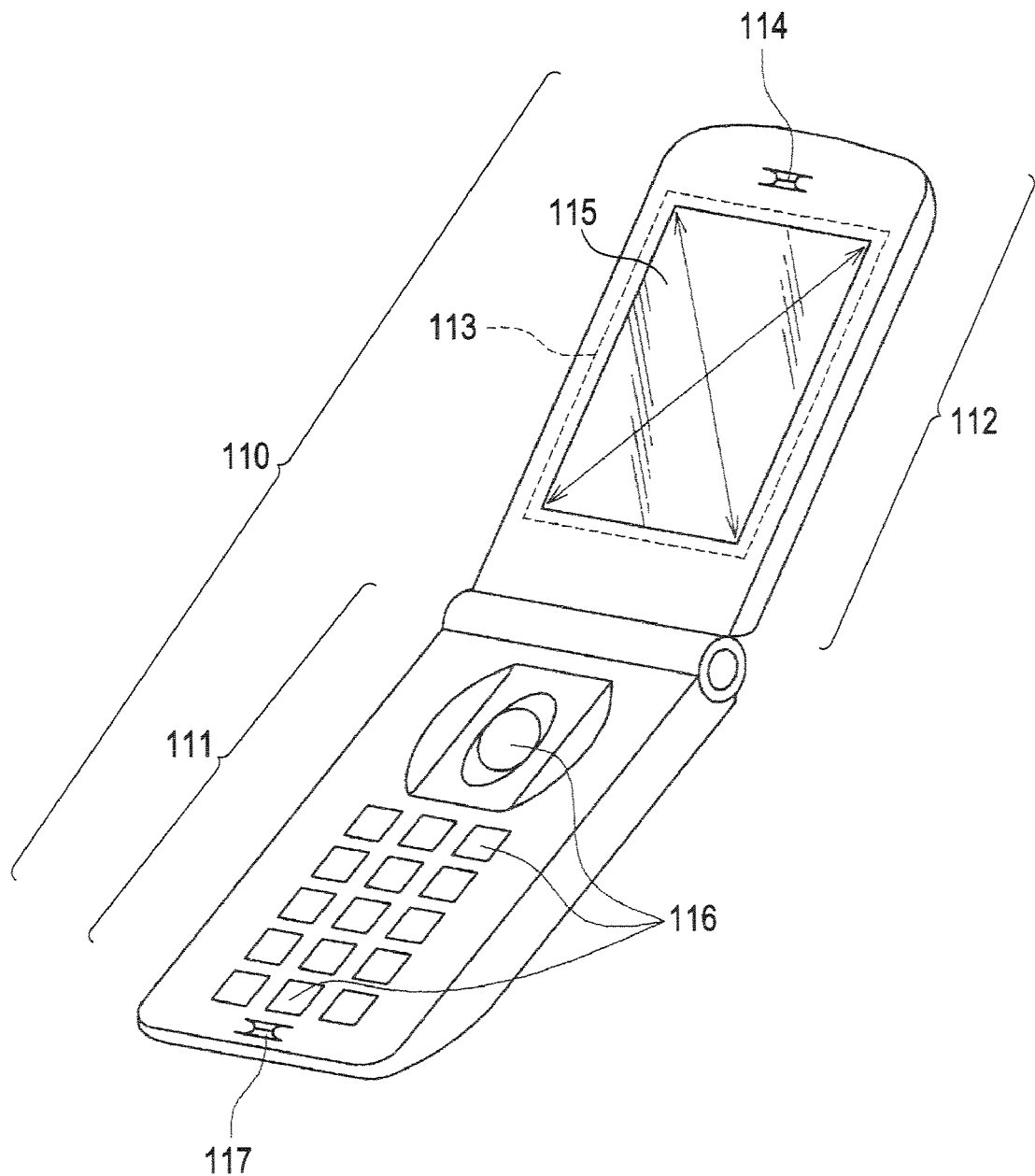
FIG. 14 is a perspective view showing a cellular phone as an electronic apparatus according to an embodiment of the invention.

FIG. 14 is a perspective view showing a cellular phone as an electronic apparatus. As shown in FIG. 14, the cellular phone 110 as the electronic apparatus includes a main body unit 111 and a display body unit 112 that is disposed to be opened or closed with respect to the main body unit 111. In the display body unit 112, a display device 113 and an ear receiver 114 are disposed. Various displays relating to telephone communication are displayed on a display screen 115 of the display device 113. A control unit used for controlling the operation of the display device 113 is housed inside the main body unit 111 or the display body unit 112 as a part of a control unit responsible for controlling the overall operation of the cellular phone or a body separated from the control unit.

In the main body unit 111, operation buttons 116 and a telephone microphone 117 are provided.

The display device 113 is, for example, configured by using the liquid crystal device 51 shown in FIG. 13. In the liquid crystal device 51, the rewiring line 11 is formed on the base substrate of the driving IC 53 and a plurality of terminals of the driving IC 53 is connected together by the rewiring line 11. Thus, even when peripheral substrates 54 and 56 of the driving IC 53 are configured as a one-sided wiring form of one layer, the degree of freedom for designing the wiring pattern can be maintained to be high, and accordingly, a complex circuit configuration can be manufactured at low cost. Therefore, although the cellular phone 110 using the liquid crystal device 51 can implement high-level functions by using the complex circuit configuration, the cellular phone has a high cost performance.

The entire disclosure of Japanese Patent Application Nos: 2007-228599, filed Sep. 4, 2007 and 2008-181432, filed Jul. 11, 2008 are expressly incorporated by reference herein.

What is claimed is:

1. A semiconductor device comprising:
    a base substrate including an internal circuit;
    a resin protrusion part that is disposed to protrude on an active face side of the base substrate; and
    a plurality of terminals that are formed by including an island-shaped conductive film disposed on the resin protrusion part,
    wherein the plurality of terminals includes a terminal that is in a conductive state with the internal circuit,
    a wiring line electrically connects at least two terminals among the plurality of terminals that are disposed on the active face side, the wiring being disposed on the active face side, the at least two terminals among the plurality of terminals not being adjacent to each other, the at least two terminals not being in a conductive state with the internal circuit.

2. The semiconductor device of claim 1, further comprising a protection film having an insulation property disposed on the active face,
    wherein the resin protrusion part is disposed on the protection film,
    the conductive film is in a conductive state with the internal circuit through an opening formed on the protection film, and
    the wiring line is formed on the protection film.

3. The semiconductor device according to claim 2, wherein the wiring line is formed of a same material as that of the conductive film and is integrally formed with the connected terminals.

4. The semiconductor device according to claim 3, wherein the film thickness of the wiring line is smaller than that of the conductive film that configures the terminals.

5. A semiconductor device comprising:
    a base substrate including an internal circuit;
    a resin protrusion part that is disposed to protrude on an active face side of the base substrate; and
    a plurality of terminals that are formed by including an island-shaped conductive film disposed on the resin protrusion part,
    wherein the plurality of terminals includes a first terminal, a second terminal and a third terminal, the first terminal and the third terminal not being in a conductive state with the internal circuit, the second terminal being in a conductive state with the internal circuit, the second terminal being disposed between the first terminal and the third terminal,
    a wiring electrically connects the first terminal and the third terminal, the wiring being disposed on the active face side.

* * * * *